United States Patent
Testi

(10) Patent No.: US 11,003,142 B2
(45) Date of Patent: *May 11, 2021

(54) TIME TO DIGITAL CONVERTER WITH INCREASED RANGE AND SENSITIVITY

(71) Applicant: Innophase, Inc., San Diego, CA (US)

(72) Inventor: Nicolo Testi, San Diego, CA (US)

(73) Assignee: INNOPHASE INC., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/706,321

(22) Filed: Dec. 6, 2019

(65) Prior Publication Data

US 2020/0110369 A1 Apr. 9, 2020

Related U.S. Application Data

(63) Continuation of application No. 16/167,488, filed on Oct. 22, 2018, now Pat. No. 10,503,122, which is a
(Continued)

(51) Int. Cl.
*H03M 1/12* (2006.01)
*G04F 10/00* (2006.01)
(Continued)

(52) U.S. Cl.
CPC ............ *G04F 10/005* (2013.01); *G04F 10/06* (2013.01); *H03L 7/091* (2013.01); *H03L 7/0992* (2013.01);
(Continued)

(58) Field of Classification Search
CPC ..... G04F 10/005; H03L 7/091; H03L 7/0992; H03L 7/0997; H04L 27/2272; H03M 1/12;
(Continued)

(56) References Cited

U.S. PATENT DOCUMENTS 4,271,412 A 6/1981 Glass et al.
4,322,819 A 3/1982 Hyatt
(Continued)

FOREIGN PATENT DOCUMENTS

CN 103795406 A 5/2014
EP 1187313 A1 3/2002
(Continued)

OTHER PUBLICATIONS

Buckel, Tobias, et al., "A Highly Reconfigurable RF-DPLL Phase Modulator for Polar Transmitters in Cellular RFICs", IEEE Transactions on Microwave Theory and Techniques, vol. 66, No. 6, Jun. 2018, 2618-2627 (10 pages.
(Continued)

*Primary Examiner* — Jean B Jeanglaude
(74) *Attorney, Agent, or Firm* — Invention Mine LLC

(57) ABSTRACT

Systems and methods are described for determining a phase measurement difference between a received modulated signal and a local clock signal. An adjusted local clock phase measurement may be determined by subtracting, from the phase measurement difference, a phase correction that is based on the frequency difference between the modulator signal's carrier frequency and the local clock's frequency. A phase modulation value may be generated by scaling the adjusted local clock phase measurement. The scaling may be based on a ratio of the modulated signal's carrier frequency and the local clock's frequency. The phase correction may be based on (i) a count of periods of the modulated signal occurring between each corrected phase measurement and (ii) a difference between the carrier frequency and the local clock frequency.

20 Claims, 17 Drawing Sheets

Related U.S. Application Data continuation-in-part of application No. 15/488,278, filed on Apr. 14, 2017, now Pat. No. 10,108,148.

(51) Int. Cl.
*H04L 27/227* (2006.01)
*H03L 7/099* (2006.01)
*H03L 7/091* (2006.01)
*G04F 10/06* (2006.01)

(52) U.S. Cl.
CPC ........ *H03L 7/0997* (2013.01); *H04L 27/2272* (2013.01)

(58) Field of Classification Search
CPC ........ H03M 1/00; H03M 1/14; H03M 1/1071; H03M 2201/63; H03M 3/38
USPC .................................. 341/156, 155
See application file for complete search history.

(56) References Cited

U.S. PATENT DOCUMENTS

| | | | |
|---|---|---|---|
| 5,325,095 | A | 6/1994 | Vadnais et al. |
| 5,493,581 | A | 2/1996 | Young et al. |
| 5,635,864 | A | 6/1997 | Jones |
| 6,161,420 | A | 12/2000 | Dilger et al. |
| 6,369,659 | B1 | 4/2002 | Delzer et al. |
| 6,373,337 | B1 | 4/2002 | Ganser |
| 6,556,636 | B1 | 4/2003 | Takagi |
| 6,587,187 | B2 | 7/2003 | Watanabe et al. |
| 6,975,165 | B2 | 12/2005 | Lopez et al. |
| 7,042,958 | B2 | 5/2006 | Biedka et al. |
| 7,095,274 | B2 | 8/2006 | Lopez et al. |
| 7,193,462 | B2 | 3/2007 | Braithwaite |
| 7,313,198 | B2 * | 12/2007 | Rahman ............ H04L 27/0014 375/295 |
| 7,332,973 | B2 | 2/2008 | Lee et al. |
| 7,400,203 | B2 | 7/2008 | Ojo et al. |
| 7,447,272 | B2 | 11/2008 | Haglan |
| 7,453,934 | B2 | 11/2008 | Seppinen et al. |
| 7,564,929 | B2 | 7/2009 | Lopez et al. |
| 7,602,244 | B1 | 10/2009 | Holmes et al. |
| 7,773,713 | B2 | 8/2010 | Cafaro et al. |
| 7,888,973 | B1 | 2/2011 | Rezzi et al. |
| 8,314,653 | B1 | 11/2012 | Granger-Jones et al. |
| 8,368,477 | B2 | 2/2013 | Moon et al. |
| 8,390,349 | B1 | 3/2013 | Ravi et al. |
| 8,421,661 | B1 | 4/2013 | Jee et al. |
| 8,498,601 | B2 | 7/2013 | Horng et al. |
| 8,666,325 | B2 | 3/2014 | Shute et al. |
| 8,774,748 | B2 | 7/2014 | Casagrande et al. |
| 8,787,511 | B2 | 7/2014 | Brunn et al. |
| 8,804,875 | B1 | 8/2014 | Xu et al. |
| 8,854,091 | B2 | 10/2014 | Hossain et al. |
| 8,929,486 | B2 | 1/2015 | Xu et al. |
| 8,941,441 | B2 | 1/2015 | Testi et al. |
| 9,024,696 | B2 | 5/2015 | Li et al. |
| 9,083,588 | B1 | 7/2015 | Xu et al. |
| 9,178,691 | B2 | 11/2015 | Shimizu et al. |
| 9,240,914 | B2 | 1/2016 | Yao |
| 9,391,625 | B1 | 7/2016 | Xu et al. |
| 9,479,177 | B1 * | 10/2016 | Buell .................... H03L 7/0992 |
| 9,497,055 | B2 | 11/2016 | Xu et al. |
| 9,519,035 | B2 | 12/2016 | Ramirez |
| 9,673,828 | B1 | 6/2017 | Xu et al. |
| 9,673,829 | B1 | 6/2017 | Xu et al. |
| 9,813,011 | B2 | 11/2017 | Despesse |
| 9,813,033 | B2 | 11/2017 | Testi et al. |
| 9,819,524 | B2 | 11/2017 | Khoury et al. |
| 9,985,638 | B2 | 5/2018 | Xu et al. |
| 10,122,397 | B2 | 11/2018 | Xu et al. |
| 10,148,230 | B2 | 12/2018 | Xu et al. |
| 10,158,509 | B2 | 12/2018 | Xu et al. |
| 10,320,403 | B2 | 6/2019 | Xu et al. |
| 2001/0001616 | A1 | 5/2001 | Rakib et al. |
| 2002/0048326 | A1 | 4/2002 | Sahlman |
| 2002/0132597 | A1 | 9/2002 | Peterzell et al. |
| 2003/0053554 | A1 | 3/2003 | McCrokle et al. |
| 2003/0058036 | A1 | 3/2003 | Stillman et al. |
| 2003/0142002 | A1 | 7/2003 | Winner et al. |
| 2003/0174783 | A1 * | 9/2003 | Rahman ............. H04L 27/0014 375/298 |
| 2004/0036538 | A1 | 2/2004 | Devries et al. |
| 2004/0100330 | A1 | 5/2004 | Chandler |
| 2004/0146118 | A1 | 7/2004 | Talwalkar et al. |
| 2005/0285541 | A1 | 12/2005 | Lechevalier |
| 2006/0078079 | A1 | 4/2006 | Lu |
| 2006/0145762 | A1 | 7/2006 | Leete |
| 2006/0193401 | A1 | 8/2006 | Lopez et al. |
| 2006/0222109 | A1 | 10/2006 | Watanabe et al. |
| 2006/0285541 | A1 | 12/2006 | Roy |
| 2007/0132511 | A1 | 6/2007 | Ryynanen et al. |
| 2008/0069514 | A1 | 3/2008 | Son et al. |
| 2008/0079497 | A1 | 4/2008 | Fang et al. |
| 2008/0112526 | A1 | 5/2008 | Yi |
| 2008/0150645 | A1 | 6/2008 | McCorquodale et al. |
| 2008/0170552 | A1 | 7/2008 | Zaks |
| 2008/0192872 | A1 | 8/2008 | Lindoff |
| 2008/0192877 | A1 | 8/2008 | Eliezer et al. |
| 2008/0205709 | A1 | 8/2008 | Masuda et al. |
| 2008/0211576 | A1 | 9/2008 | Moffatt et al. |
| 2008/0220735 | A1 | 9/2008 | Kim et al. |
| 2008/0225981 | A1 | 9/2008 | Reddy et al. |
| 2008/0225984 | A1 | 9/2008 | Ahmed et al. |
| 2008/0291064 | A1 | 11/2008 | Johansson et al. |
| 2009/0153244 | A1 | 6/2009 | Cabanillas et al. |
| 2009/0256601 | A1 | 10/2009 | Zhang et al. |
| 2009/0295493 | A1 | 12/2009 | Lee et al. |
| 2009/0302908 | A1 | 12/2009 | Nakamura |
| 2010/0303047 | A1 | 12/2010 | Ibrahim et al. |
| 2011/0003571 | A1 | 1/2011 | Park et al. |
| 2011/0019657 | A1 | 1/2011 | Zaher |
| 2011/0050296 | A1 | 3/2011 | Fagg |
| 2011/0140737 | A1 | 6/2011 | Rivoir |
| 2011/0159877 | A1 | 6/2011 | Kenington et al. |
| 2011/0260790 | A1 | 10/2011 | Haddad |
| 2011/0298557 | A1 | 12/2011 | Kobayashi |
| 2011/0299632 | A1 | 12/2011 | Mirzaei et al. |
| 2011/0300885 | A1 | 12/2011 | Darabi et al. |
| 2012/0032718 | A1 | 2/2012 | Chan et al. |
| 2012/0074990 | A1 | 3/2012 | Sornin |
| 2012/0256693 | A1 | 10/2012 | Raghunathan et al. |
| 2012/0306547 | A1 | 12/2012 | Arora et al. |
| 2013/0143509 | A1 | 6/2013 | Horng et al. |
| 2013/0257494 | A1 | 10/2013 | Nikaeen et al. |
| 2014/0023163 | A1 | 1/2014 | Xu |
| 2014/0133528 | A1 | 5/2014 | Noest et al. |
| 2014/0185723 | A1 | 7/2014 | Belitzer |
| 2014/0266454 | A1 | 9/2014 | Testi et al. |
| 2014/0266480 | A1 | 9/2014 | Li et al. |
| 2014/0269999 | A1 | 9/2014 | Cui et al. |
| 2014/0270003 | A1 | 9/2014 | Xu et al. |
| 2014/0321479 | A1 | 10/2014 | Zhang et al. |
| 2015/0180685 | A1 | 6/2015 | Noest et al. |
| 2015/0207499 | A1 | 7/2015 | Horng et al. |
| 2015/0229318 | A1 | 8/2015 | Tamura et al. |
| 2016/0074224 | A1 | 3/2016 | Scheller et al. |
| 2016/0139568 | A1 | 5/2016 | Schimper |
| 2016/0155558 | A1 | 6/2016 | Groves et al. |
| 2016/0169717 | A1 | 6/2016 | Zhitomirsky |
| 2017/0085405 | A1 | 3/2017 | Xu et al. |
| 2017/0163272 | A1 | 6/2017 | Xu et al. |
| 2017/0187364 | A1 | 6/2017 | Park et al. |
| 2017/0194973 | A1 | 7/2017 | Moehlmann |
| 2018/0196972 | A1 | 7/2018 | Lu et al. |
| 2018/0205384 | A1 | 7/2018 | Lee |
| 2018/0287646 | A1 | 10/2018 | Xu et al. |

(56) References Cited

U.S. PATENT DOCUMENTS

2019/0059055 A1 2/2019 Murali
2020/0083857 A1 3/2020 Testi et al.

FOREIGN PATENT DOCUMENTS

| EP | 1187313 B1 | 2/2008 |
|---|---|---|
| JP | H07221570 A | 8/1995 |
| JP | H1188064 A | 3/1999 |
| JP | 2012134981 A | 7/2012 |
| KR | 20150007728 A | 1/2015 |
| WO | 2005078921 A2 | 8/2005 |
| WO | 2005078921 A3 | 4/2006 |
| WO | 2012132847 A1 | 10/2012 |

OTHER PUBLICATIONS

Markulic, Nereo, et al., "A self-calibrated 10Mb/s phase modulator with −37.4dB EVM based on a 10.1-to-246.6dB-FOM, fractional-n subsampling PLL", IEEE International Solid-State Circuits Conference (ISSCC), San Francisco, Session 9.7, 2016, 176-178 (3 pages).
Marzin, Giovanni, et al., "A 20Mb/s Phase Modulator Based on a 3.6GHz Digital PLL with −36dB EVM at 5 mW Power", IEEE International Solid-State Circuits Conference, vol. 47, No. 12, Dec. 2012, 2974-2988 (15 pages).
International Search Report and Written Opinion for PCT/US2014/029055, dated Sep. 15, 2014, 1-12 (12 pages).
International Search Report and Written Opinion for PCT/US2016/053484, dated Dec. 19, 2016, 1-8 (8 pages).
International Search Report and Written Opinion for PCT/US2016/064772, dated Feb. 28, 2017, 1-7 (7 pages).
International Preliminary Report on Patentability for PCT/US2018/027222 completed Apr. 4, 2019, dated Jun. 20, 2019, 1-3 (3 pages).
International Search Report and Written Opinion for PCT/US2014/030525, dated Jul. 24, 2014, 1-16 (16 pages).
International Search Report and Written Opinion for PCT/US2014/026459, dated Jul. 28, 2014, 1-10 (10 pages).
International Search Report and Written Opinion of the International Searching Authority for PCT/US13/024159, dated Apr. 9, 2013, 1-8 (8 pages).
International Preliminary Report on Patentability for PCT/US2016/064772, dated Jun. 14, 2018, 1-6 (6 pages).
International Search report and Written Opinion for PCT/US18/27222, dated Jun. 28, 2018, 1-6 (6 pages).
Aeroflex, "Measurement of Frequency Stability and Phase Noise", Application Note, Part No. 46891/865, Issue 1, Feb. 2007, 1-8 (8 pages).
Betancourt-Zamora, Rafael, et al., "1-GHz and 2.8-GHz CMOS Injection-Locked Ring Oscillator Prescalers", Allen Center for Integrated Systems, Stanford University, Conference Paper, Feb. 2001, 1-5 (5 pages).
Chen, Chi-Tsan, et al., "Cognitive Polar Receiver Using Two Injection-Locked Oscillator Stages", IEEE Transactions on Microwave Theory and Techniques, vol. 59, No. 12, Dec. 2011, 3484-3493 (10 pages).
Chen, Chi-Tsan, et al., "Wireless Polar Receiver Using Two Injection-Locked Oscillator Stages for Green Radios", IEEE MTT-S International, Jun. 2011, 1-4 (4 pages).
Cheng, Mao, et al., "A 1.3mW 0.6V WBAN-Compatible Sub-Sampling PSK Receiver in 65nm CMOS", IEEE International Solid-State Circuits Conference, ISSCC Session 9.6, Feb. 11, 2014, 168-170 (3 pages).
Chien, Jun-Chau, et al., "Analysis and Design of Wideband Injection-Locked Ring Oscillators With Multiple-Input Injection", IEEE Journal of Solid-State Circuits, vol. 42, No. 9, Sep. 2007, 1906-1915 (10 pages).
Darvishi, Milad, et al., "A 0.3-to-1.2GHz Tunable 4th-Order Switched gm-C Bandpass Filter with >55dB Ultimate Rejection and Out-of-Band IIP3 of +29dBm", 2012 IEEE International Solid-State Circuits Conference, Session 21.1, 2012, 358-360 (3 pages).
Dudek, Piotr, et al., "A High-Resolution CMOS Time-to-Digital Converter Utilizing a Vernier Delay Line", IEEE Transactions on Solid-State Circuits, vol. 35, No. 2, Feb. 2000, 240-247 (8 pages).
Effendrik, Popong, "Time-to-Digital Converter (TDC) for WiMAX ADPLL in State-of-The-Art 40-nm CMOS", MSc Theses, Delft University of Technology, Apr. 18, 2011, 1-80 (80 pages).
Frantz, Claude, "Frequency Discriminator", DJ0OT, 1994, 1-7 (7 pages).
He, Xin, et al., "A 2.5-GHz Low-Power, High Dynamic Range, Self-Tuned Q-Enhanced LC Filter in SOI", IEEE Journal of Solid-State Circuits, vol. 40, No. 8, Aug. 2005, 1618-1628 (11 pages).
He, Xin et al., "A Fully Integrated Q-enhanced LC Filter with 6 dB Noise Figure at 2.5 GHz in SOI", IEEE Radio Frequency Integrated Circuits Symposium, 2004, 643-646 (4 pages).
Henzler, S. , "Time to Digital Converters", Springer Series in Advanced Microelectronics 29, Chapter 2, Springer Science+Business Media B.V., 2010, 5-19 (15 pages).
Hewlett Packard , "Phase Noise Characterization of Microwave Oscillators", Frequency Discriminator Method, Product Note 11729C-2, Sep. 1985, 1-45 (45 pages).
Jovanovic, G.S. , et al., "Vernier's Delay Line Time-to-Digital Converter", Scientific Publications of the State University of Novi Pazar, Ser. A: Appl. Math. Inform. and Mech., vol. 1, Jan. 2009, 11-20 (10 pages).
Li, Dandan, et al., "Design Techniques for Automatically Tuned Integrated Gigahertz-Range Active LC Filters", IEEE Journal of Solid- State Circuits, vol. 37, No. 8, Aug. 2002, 967-977 (11 pages).
Liao, Dongyi et al. "An 802.11a/b/g/n Digital Fractional-N PLL With Automatic TDC Linearity Calibration for Spur Cancellation", IEEE Journal of Solid-State Circuits, 0018-9200, Jan. 16, 2017, 1-11 (11 pages).
Lin, Chin-Hsin, et al., "Single-Stage Vernier Time-to-Digital Converter with Sub-Gate Delay Time Resolution", Scientific Research, Circuits and Systems, vol. 2, Oct. 2011, 365-371 (7 pages).
Liscidini, Antonio, et al., "Time to Digital Converter based on a 2-dimensions Vernier architecture", University of Pavia, IEEE Custom Integrated Circuits Conference, Sep. 13, 2009, 1-4 (4 pages).
López-Villegas, José Maria , et al., "BPSK to ASK Signal Conversion Using Injection-Locked Oscillators—Part I: Theory", IEEE Transactions on Microwave Theory and Techniques, vol. 53, No. 12, Dec. 2005, 3757-3766 (10 pages.
Mirzaei, Ahmad, et al., "Multi-Phase Injection Widens Lock Range of Ring-Oscillator-Based Frequency Dividers",IEEE Journal of Solid-State Circuits, vol. 43, No. 3, Mar. 2008, 656-671 (16 pages.
Nazari, Peyman, "Polar Quantizer for Wireless Receivers: Theory, Analysis, and CMOS Implementation", IEEE Transactions on Cricuits and Systems, vol. 61, No. 3, Mar. 2014, 1-94 (94 pages).
O'Brien, Paul, "A Comparison of Two Delay Line Discriminator Implementations for Low Cost Phase Noise Measurement", Analog Devices Raheen Business Park Limerick Ireland, 2010, 1-11 (11 pages).
Pellerano, Stefano, et al., "A 4.75-GHz Fractional Frequency Divider-by-1.25 With TDC-Based All-Digital Spur Calibration in 45-nm CMOS", IEEE Journal of Solid-State Circuits, vol. 44, No. 12, Dec. 2009, 3422-3433 (12 pages).
Putnam, William, et al., "Design of Fractional Delay Filters Using Convex Optimization", IEEE ASSP Workshop on Applications of Signal Processing to Audio and Acoustics (CCRMA), Stanford University, 1997, 1-5 (5 pages).
Rategh, Hamid R., et al., "Superharmonic Injection Locked Oscillators as Low Power Frequency Dividers", Stanford University, Symposium on VLSI Circuits, Digest of Technical Papers, Jun. 1998, 1-4 (4 pages).
Razavi, Behzad, "A Study of Injection Pulling and Locking in Oscillators", Electrical Engineering Department, University of California, IEEE Custom Integrated Circuits Conference, 2003, 305-312 (8 pages).
Ross, Andrew, "Power Save Issues in WLAN", Silex Technology America, Inc., 2014, 1-35 (35 pages).
Siripon, N., et al., "Novel Sub-Harmonic Injection-Locked Balanced Oscillator", Microwave and Systems Research Group (MSRG),

(56) References Cited

OTHER PUBLICATIONS

School of Electronics, Computing and Mathematics, University of Surrey, 31st European Microwave Conference, Sep. 24, 2011, 1-4 (4 pages).

Testi, Nicolo, et al., "A 2.4GHz 72dB-Variable-Gain 100dB-DR 7.8mW 4th-Order tunable Q-Enhanced LC Band-Pass Filter.", IEEE Radio Frequency Integrated Circuits Symposium (RFIC), 2015, 87-90 (4 pages).

Tiebout, Marc, "A 50GHz Direct Injection Locked Oscillator Topology as Low Power Frequency Divider in 0.13 µm CMOS", Intineon Technologies AG, Solid-State Circuits Conference, 29th European ESSCIRC, 2003, 1-4 (4 pages).

Tsai, Pei-Kang, et al., "Wideband Injection-Locked Divide-by-3 Frequency Divider Design with Regenerative Second-Harmonic Feedback Technique", Wideband Injection-Locked Divide-by-3 Frequency Divider Design with Regenerative Second-Harmonic Feedback Technique, Mar. 21, 2013, 1-4 (4 pages).

US Navy , "Electronic Warfare and Radar Systems Engineering Handbook", Naval Air Systems Command and Naval Air Warfare Center, USA, Mixers and Frequency Discriminators, Section 6-8.1 to 6-8.2, Apr. 1, 1999, 1-299 (299 pages).

Winoto, Renaldi, et al., "A 2×2 WLAN and Bluetooth Combo SoC in 28nm CMOS with On-Chip WLAN Digital Power Amplifier, Integrated 2G/BT SP3T Switch and BT Pulling Cancelation", IEEE International Solid-State Circuits Conference, ISSCC 2016, Session 9.4, High-Performance Wireless, Feb. 2, 2016, 170-172 (3 pages).

Wiser, Robert F., et al., "A 5-GHz Wireless LAN Transmitter with Integrated Tunable High-Q RF Filter", IEEE Journal of Solid-State Circuits, vol. 44, No. 8, Aug. 2009, 2114-2125 (12 pages).

Yu, Jianjun, et al., "A 3-Dimensional Vernier Ring Time-to-digital Converter in 0.13µm CMOS", Electrical and Computer Engineering, Auburn University, Auburn AL, Sep. 19, 2010, 1-4 (4 pages).

International Search report and Written Opinion for PCT/US20/12607, dated May 7, 2020, 1-17 (17 pages).

Li, Xiaoyong , et al., "20-Mb/s GFSK Modulator Based on 3.6-GHz Hybrid PLL with 3-b DCO Nonlinearity Calibratio and Independent Delay Mismatch Control", IEEE Transactions on Microwave Theory and Techniques, vol. 65, No. 7, Jul. 2017, 2387-2398 (12 pages).

International Search Report and Written Opinion for PCT/US2019/067237, dated Apr. 24, 2020, 1-14 (14 pages).

International Search Report and Written Opinion for PCT/US2019/049493, dated Apr. 29, 2020, 1-10 (10 pages).

International Search Report and Written Opinion for PCT/US2019/057432, dated Apr. 6, 2020, 1-9 (9 pages).

* cited by examiner

TIME TO DIGITAL CONVERTER WITH INCREASED RANGE AND SENSITIVITY

CROSS-REFERENCE TO RELATED APPLICATIONS

This application is a continuation of U.S. application Ser. No. 16/167,488, filed Oct. 22, 2018, entitled "TIME TO DIGITAL CONVERTER WITH INCREASED RANGE AND SENSITIVITY," which is a continuation-in-part of U.S. application Ser. No. 15/488,278, filed Apr. 14, 2017, now U.S. Pat. No. 10,108,148, entitled "TIME TO DIGITAL CONVERTER WITH INCREASED RANGE AND SENSITIVITY," all of which are hereby incorporated herein by reference in their entirety.

BACKGROUND

Time to Digital Converters (TDC) are generally used to provide a digital output representing a timing value. A typical TDC circuit measures a time difference between two events: a start and a stop event. In its simplest form, a counter updates based on a high frequency oscillator running at a frequency $f_0$. The counter updates once every period $$\left(\frac{1}{f_0}\right).$$

The TDC circuit initiates the counter when the start event occurs. The TDC reads the state of the counter when the stop event occurs and stores the value as the stop counter value. The count value, in conjunction with the counter update rate (or the period $$\left(\frac{1}{f_0}\right)$$

) may be used to determine the time difference between the start and stop events.

SUMMARY

In one example embodiment, a TDC uses a combination of coarse and fine measurements to obtain a time measurement. In a further embodiment, the TDC is used within a demodulator of a low power receiver. In some applications, the receiver is a low power, high performance RF system on-chip (SoC) using nanometer technology that features a low, core supply voltage. Taking advantage of nanometer process technology, the receiver's integrated circuit (IC) implements various levels of digital tuning to optimize the analog/RF performance. This specification describes an example receiver's Time to Digital Converter (TDC) to demodulate a received signal, where the demodulation may include removal of the carrier period, scaling and accumulation of the result, and a resampler, which in some embodiments uses a First In, First Out (FIFO) memory in conjunction with a sampling timer circuit.

A receiver time signal is converted to a digital word using coarse and fine TDC components. The coarse TDC portion uses a ring oscillator to calculate a coarse estimate of the length of time delay. The fine TDC portion uses a two-dimensional Vernier structure to calculate a fine resolution estimate of coarse measurement error. The system combines the coarse measurement with the fine measurement to calculate the digital time measurement. The system further processes the output word to handle counter rollover, to prepare a result at the proper sampling times for the baseband read circuit, to remove the carrier period offset, and to scale the resulting signal. For an example receiver, the resulting signal is stored in a FIFO and read from the FIFO when needed by a baseband circuit.

In one example embodiment, a coarse measurement circuit measures a coarse measurement of the time period between a first rising edge and a second rising edge of the modulated signal (or a frequency divided or down-converted version thereof). In one non-limiting example, it operates for input periods between 2.5 ns and 5 ns. Those periods correspond to input frequencies between 200 MHz and 400 MHz. The Rx TDC comprises a coarse TDC, a fine TDC, and some digital reconstruction circuits. A coarse and fine structure is used in order to meet the desired range and resolution requirements. In the receiver, the coarse TDC generally takes care of the range, while the fine TDC generally takes care of the resolution.

The coarse TDC provides a first coarse measurement of the input period. For one example embodiment, a coarse TDC resolution is 160 ps, and it is based on a ring oscillator-type TDC. At every input rising edge, the system probes the state of the ring oscillator and generates the signals to be passed to the fine TDC circuit. The coarse measurement of the input period is achieved by analyzing the state of the ring oscillator chain and the counters connected to it. Because the ring oscillator in one embodiment avoids resetting during operation, its output corresponds to the accumulation of the sequence of input periods.

The fine TDC provides a finer measurement of the input period and serves as an error measurement of the coarse measurement. In one embodiment, it comprises a two-dimensional Vernier structure. The coarse TDC generates the input signals to be injected into the fine TDC's slow and fast delay lines. The input signals to the fine TDC are (i) the rising edge of the received modulated signal (suitably delayed) and the corresponding output of a coarse TDC ring oscillator element. The fine measurement happens after the coarse measurement has finished. The fine TDC operates on an edge injected into the slow line, which will take longer to propagate than an edge injected into the fast line. Based on where in the corresponding arbiter's grid the edge injected in the fast delay line catches up to the edge injected in the slow delay line, the system calculates the fine TDC value. The system combines the coarse measurement and the fine measurement to obtain the final measurement. In one example embodiment, a receiver's fine measurement circuit uses twelve 50 ps delays in the slow line and nine 45 ps delays in the fast line. The arbiter matrix uses five Vernier lines to provide a range of 240 ps and a resolution of 5 ps. The topology of the Rx TDC allows a wide input range (2.5 ns to 5 ns) with a small resolution size (5 ps). Each consecutive measurement corresponds to the accumulation of all the input periods up to that moment.

In a further embodiment, the TDC measures the time between a local clock reference and the next rising edge of the modulated signal (or a frequency divided or down-converted version thereof).

Some embodiments of a method may include: receiving, at a receive phase-to-digital conversion (PDC) circuit, a modulated signal having a carrier frequency; obtaining a phase measurement between the modulated signal and a local clock signal; generating a carrier-based phase correction value by accumulating a phase-correction increment;

generating a corrected phase measurement value based on a difference between the phase measurement and the carrier-based phase correction value; and generating a carrier phase measurement by scaling the corrected phase measurement value.

In some embodiments, generating the phase correction increment may be based on (i) a count of periods of the modulated signal occurring between each generation of a corrected phase measurement, and (ii) a difference between the carrier frequency and a frequency of the local clock signal.

With some embodiments, generating the carrier-based phase correction value may be inhibited if a rising edge of the modulated signal does not occur within a timing window.

For some embodiments, obtaining the phase measurement may include: determining a coarse measurement by determining a phase interval of a plurality of phase intervals of the local clock that coincides with a rising edge of the modulated signal; determining a fine measurement error of the coarse measurement; and determining the phase measurement by combining the coarse measurement and the fine measurement error.

In some embodiments, combining the coarse measurement and the fine measurement may include: scaling the coarse measurement by a coarse measurement scaling factor; and scaling the fine measurement error by a fine measurement scaling factor.

With some embodiments, scaling the coarse measurement may convert the coarse measurement from an index of the phase interval to a phase angle value, and scaling the fine measurement may convert the fine measurement error from a time value to phase with respect to the local clock signal.

For some embodiments, determining the phase interval may be determined according to a state of a plurality of ring oscillator elements.

In some embodiments, determining the fine measurement error may include: injecting, into a slow line of two-dimensional Vernier delay elements, a rising edge of the modulated signal; injecting, into a fast line of two-dimensional Vernier delay elements, an output of the ring oscillator associated with the determined phase interval; and determining a fine measurement error using a matrix of arbiters connected between the slow line and fast line.

With some embodiments, generating the carrier phase measurement may include scaling the corrected phase measurement by a multiple of a ratio of the carrier frequency to the frequency of the local clock signal.

For some embodiments, a method may further include preprocessing the modulated signal by reducing the frequency using a harmonic injection ILO.

In some embodiments, a method may further include preprocessing the modulated signal by reducing the frequency using a divider circuit.

With some embodiments, a method may further include preprocessing the modulated signal by reducing the frequency using a mixer circuit.

Some embodiments of an apparatus may include: an analog receiver circuit configured to receive a modulated signal having a carrier frequency; a phase-to-digital conversion (PDC) circuit coupled to the analog receiver circuit and configured to obtain a phase measurement between the modulated signal and a local clock signal; a carrier-based phase correction circuit coupled to the PDC circuit and configured to generate a carrier-based phase correction value by accumulating a phase-correction increment; a corrected phase measurement circuit coupled to the carrier-based phase correction circuit and configured to generate a corrected phase measurement value based on a difference between the phase measurement and the carrier-based phase correction value; and a carrier phase measurement circuit coupled to the corrected phase measurement circuit and configured to generate a carrier phase measurement by scaling the corrected phase measurement value.

For some embodiments, the carrier-based phase correction circuit may include a lookup table.

In some embodiments, the phase correction increment may be based on (i) a count of periods of the modulated signal occurring between each generation of a corrected phase measurement, and (ii) a difference between the carrier frequency and a frequency of the local clock signal.

For some embodiments, the count of periods of the modulated signal may be used to control a multiplexer to select a table entry storing a multiple of a single period carrier offset value.

With some embodiments, an apparatus may further include an overflow circuit coupled to the corrected phase measurement circuit and configured to inhibit generating the carrier-based phase correction value if a rising edge of the modulated signal does not occur within a timing window.

For some embodiments, the PDC circuit may include: a coarse measurement circuit configured to determine a coarse measurement by determining a phase interval of a plurality of phase intervals of the local clock that coincides with a rising edge of the modulated signal; a fine measurement error circuit coupled to the coarse measurement circuit and configured to determine a fine measurement error of the coarse measurement; and a phase measurement circuit coupled to the fine measurement circuit and configured to determine the phase measurement by combining the coarse measurement and the fine measurement error.

In some embodiments, an apparatus may further include: a coarse measurement scaling circuit coupled to the coarse measurement circuit and configured to scale the coarse measurement by a coarse measurement scaling factor; and a fine measurement scaling circuit coupled to the fine measurement error circuit and configured to scale the fine measurement error by a fine measurement scaling factor.

With some embodiments, the coarse measurement scaling circuit may use the coarse measurement scaling factor to convert the coarse measurement from an index of the phase interval to a phase value, and the fine measurement scaling circuit may use the fine measurement scaling factor to convert the fine measurement error from a time value to phase with respect to the local clock signal.

For some embodiments, the coarse measurement circuit may include a plurality of ring oscillator elements.

In some embodiments, the fine measurement error circuit may include: a first set of one or more inverters forming a first line of delay elements; a second set of one or more inverters forming a second line of delay elements, wherein the first line of delay elements is slower than the second line of delay elements; a matrix of latches equal to the number of inverters in the first line of delay elements times the number of inverters in the second line of delay elements; a set of connections that connect each inverter output in the first line of delay elements to each first latch input in a column of the matrix of latches; and a set of connections that connect each inverter output in the second line of delay elements to each second latch input in a row of the matrix of latches.

With some embodiments, the carrier phase measurement circuit may include a multiplier element configured to scale the corrected phase measurement by a multiple of a ratio of the carrier frequency to the frequency of the local clock signal.

For some embodiments, an apparatus may further include a harmonic injection ILO to reduce the frequency of the modulated signal.

In some embodiments, an apparatus may further include a divider circuit to reduce the frequency of the modulated signal.

With some embodiments, an apparatus may further include a mixer circuit to reduce the frequency of the modulated signal.

Some embodiments of a method may include: obtaining a plurality of phase measurements of a local clock associated with signal transitions of a carrier having a carrier frequency and a phase-modulation component; generating an adjusted local clock phase measurement by subtracting an offset based on a frequency difference between the carrier frequency and a frequency of the local clock; and generating a phase modulation value by scaling the adjusted local clock phase measurement based on a ratio between the carrier frequency and the frequency of the local clock.

Some embodiments of a method may include: generating a phase measurement value of a modulated carrier with respect to a phase domain of a local clock using a phase-to-digital converter; and converting the phase measurement value to a modulation phase value based on a ratio between a carrier frequency of the modulated carrier and a frequency of the local clock.

Figure 1:
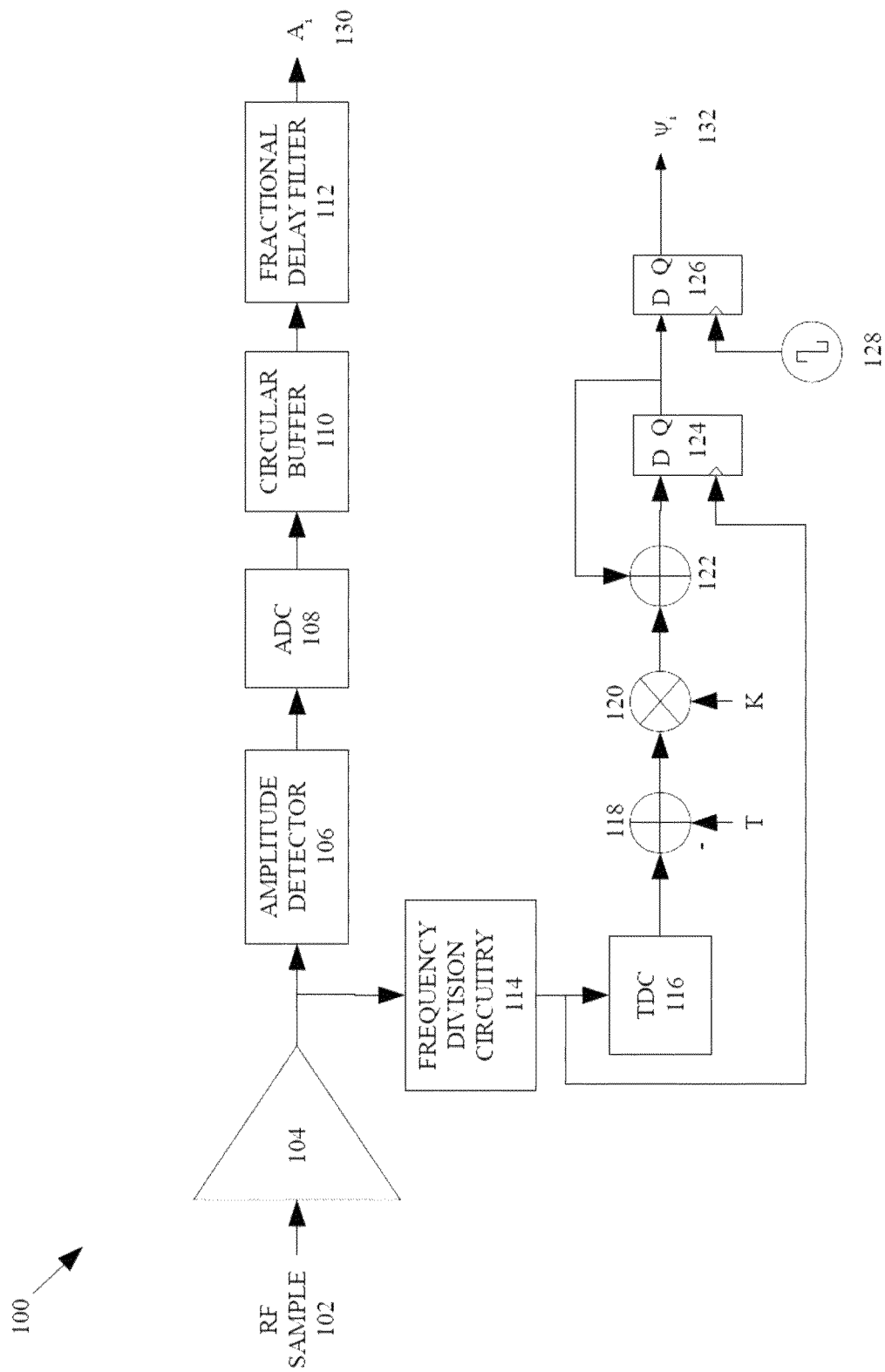
FIG. 1 is a block diagram of a polar receiver according to some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

The entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—may only properly be read as being constructively preceded by a clause such as "In at least one embodiment, . . . ." For brevity and clarity of presentation, this implied leading clause is not repeated ad nauseum in the detailed description of the drawings.

DETAILED DESCRIPTION

In one example embodiment, an Rx TDC covers a large range (several nanoseconds) with a small resolution ($5 \times 10^{-12}$ seconds or 5 ps). Various embodiments use a sequence of coarse and fine time measurements to meet the range and resolution usage. Starting with a signal previously processed by other elements of a receive circuit (which will be labeled as the modulated signal), various circuits described herein make a coarse estimate of the period. The circuit makes a fine resolution estimate of the error. The system combines these coarse and fine measurements to arrive at an estimate of the input signal's period. Further processing occurs to convert the time measurement to a phase measurement.

FIG. 1 is a block diagram of an example polar receiver. A radio frequency signal 102 is received by a polar receiver 100 and may be amplified by an amplifier 104. The polar receiver 100 operates to receive and decode modulated radio-frequency signals, such as signals modulated using phase shift keying (PSK) or quadrature amplitude modulation (QAM). The amplifier's output signal connects to separate paths for amplitude and phase.

The amplitude path starts with an amplitude detector 106 such as an envelope detector or a power detector, which operates to provide a signal representing the amplitude of the modulated radio-frequency signal. The amplitude detector 106 may operate using various techniques such as, for example, signal rectification followed by low-pass filtering. The amplitude signal goes through an analog-to-digital converter (ADC) 108. The ADC operates to generate a series of digital amplitude signals representing the amplitude of the sampled radio-frequency signal. In some embodiments, ADC 108 samples the amplitude of the modulated radio-frequency signal at 160 Msps. The ADC's output is stored in a circular buffer 110. Samples stored in the circular buffer are read and delayed via a fractional delay filter 112 and outputted as amplitude sample $A_i$ 130.

The polar receiver 100 is provided with frequency division circuitry 114. In addition, a limiter circuit (not shown) may be used to remove any amplitude information from the signal but which preserves the phase information. In some embodiments, and ILO may be used to remove the amplitude information. The frequency division circuitry has an input for receiving the sampled radio-frequency input signal from the buffer 104 and a frequency-divided output for providing a frequency-divided output signal to a trigger input of a time-to-digital converter (TDC) 116. The frequency division circuitry operates to divide the frequency of the input signal by a frequency divisor. In some embodiments, the frequency division circuitry can be implemented using a harmonic injection-locked oscillator, a digital frequency divider, or a combination thereof, among other possibilities. The frequency division circuitry 114 also acts as an amplitude normalization circuit.

For the phase path, the amplifier's output connects to frequency division circuitry 114 that divides the frequency (by 4 in one embodiment). The frequency division output signal goes into the time-to-digital (TDC) 116 to calculate a digital time output. The time-to-digital converter 116 operates to measure a characteristic time of the frequency-divided signal, such as the period of the frequency-divided signal. The time-to-digital converter 116 may operate to measure the period of the frequency-divided signal by measuring an elapsed time between successive corresponding features of the frequency-divided signal. For example, the time-to-digital converter may measure the period of the frequency-divided signal by measuring a time between successive rising edges of the frequency-divided signal or the time between successive falling edges of the frequency-divided signal. In alternative embodiments, the time-to-digital converter may measure a characteristic time other than a complete period, such as an elapsed time between a rising edge and a falling edge of the frequency-divided signal.

Figure 7:
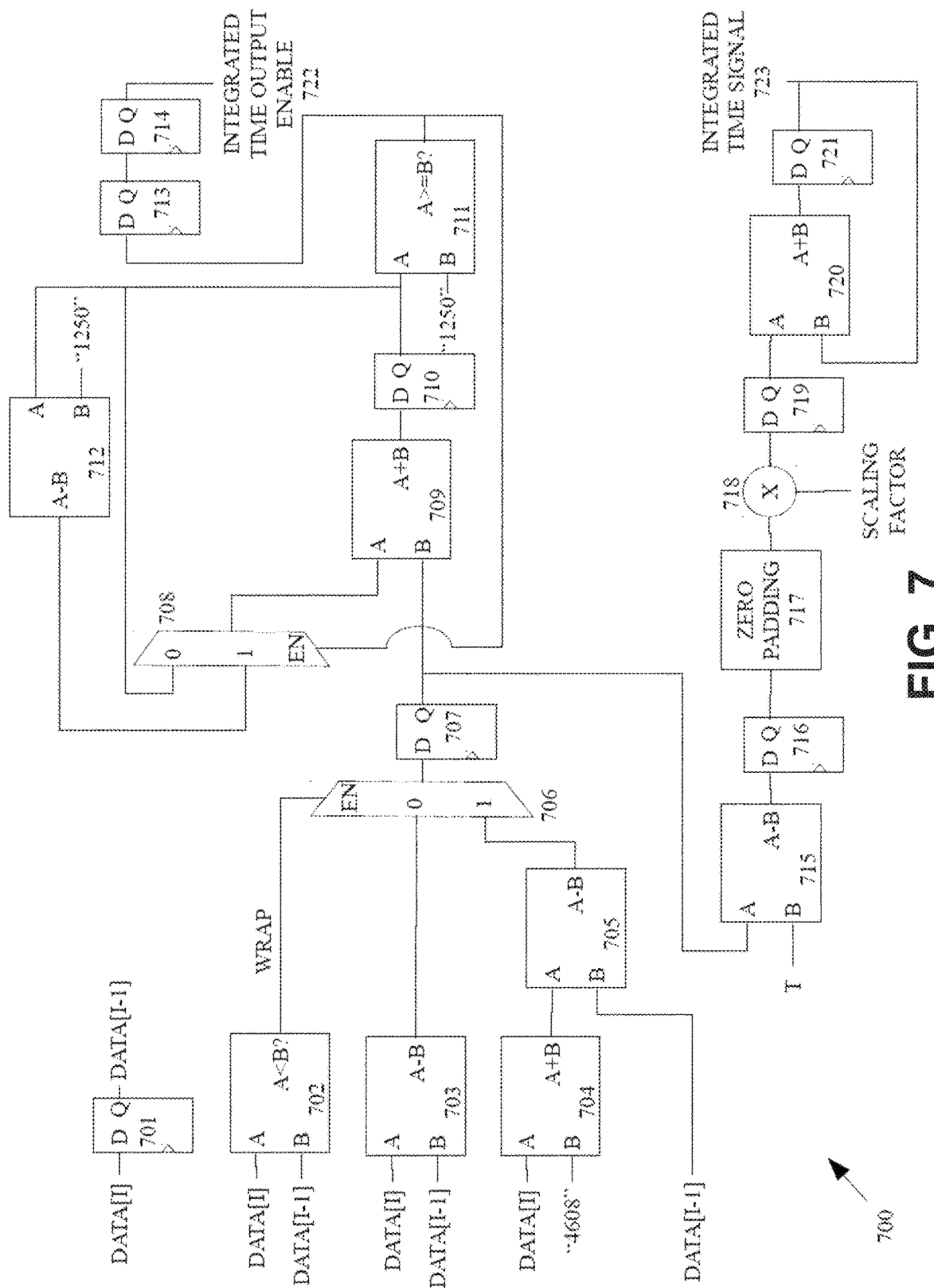
FIG. 7 is a digital component block diagram of signal processing performed on a digital time measurement according to some embodiments.

In some embodiments, the time-to-digital converter 116 operates without the use of an external trigger such as a clock signal. That is, the time-to-digital converter 116 measures the time between two features (e.g., two rising edges) of the frequency-divided signal rather than the time between an external trigger signal and a rising edge of the frequency-divided signal. Because the start and end of the time period measured by the time-to-digital converter 116 are both triggered by the frequency-divided signal, rather than an external clock signal, the time-to-digital converter 116, is referred to as a self-triggered time-to-digital converter. In the example of FIG. 7, the self-triggered time-to-digital converter 116 provides a digital time output that represents the period of the frequency-divided output signal.

The carrier period offset (T) is subtracted from the digital time output by adder 118. The offset digital time output is thus at or near zero when no shift is occurring in the phase of the frequency-divided signal. When a phase shift does occur in the sampled radio-frequency signal (a phase-modulated or frequency modulated carrier signal), this results in a temporary change in the period of the sampled radio-frequency signal, which in turn causes a temporary change in the period of the frequency-divided signal. This temporary change in the period of the frequency-divided signal is measured as a temporary change in the digital time output (and in the offset digital time output). In some embodiments, the offset digital time output is at or near zero during periods when the phase of the modulated radio-frequency signal remains steady, while a shift in the phase of the modulated radio-frequency signal results in the offset digital time output signal briefly taking on a positive or negative value, depending on the direction of the phase shift.

The offset digital time output may be scaled by a scaling factor via a multiplier 120. The scaled digital time signal (or offset digital time output in some embodiments) is accumulated by adder 122 and register 124. The digital integrator generates an integrated time signal. The register 124 may be clocked using the frequency-divided signal, resulting in an addition per cycle of the frequency-divided signal. In embodiments in which the offset digital time output signal represents a change in the phase of the sampled radio-frequency signal, the integrated time signal provides a value that represents the current phase of the sampled radio-frequency signal.

The accumulated value goes through another register 126 to be read at the appropriate time based on the input pulse 128. In some embodiments, the register 126 operates to sample the integrated time signal at 160 Msps, although other sampling rates may alternatively be used. The output is a phase sample $\psi_i$ 132. In the embodiment of FIG. 7, frequency division circuitry 114, TDC 116, subtractor 118, multiplier 120, adder 122, and registers 124 and 126 operate as a phase detection circuit operative to generate a series of digital phase signals representing the phase of the sampled signal.

Figure 2:
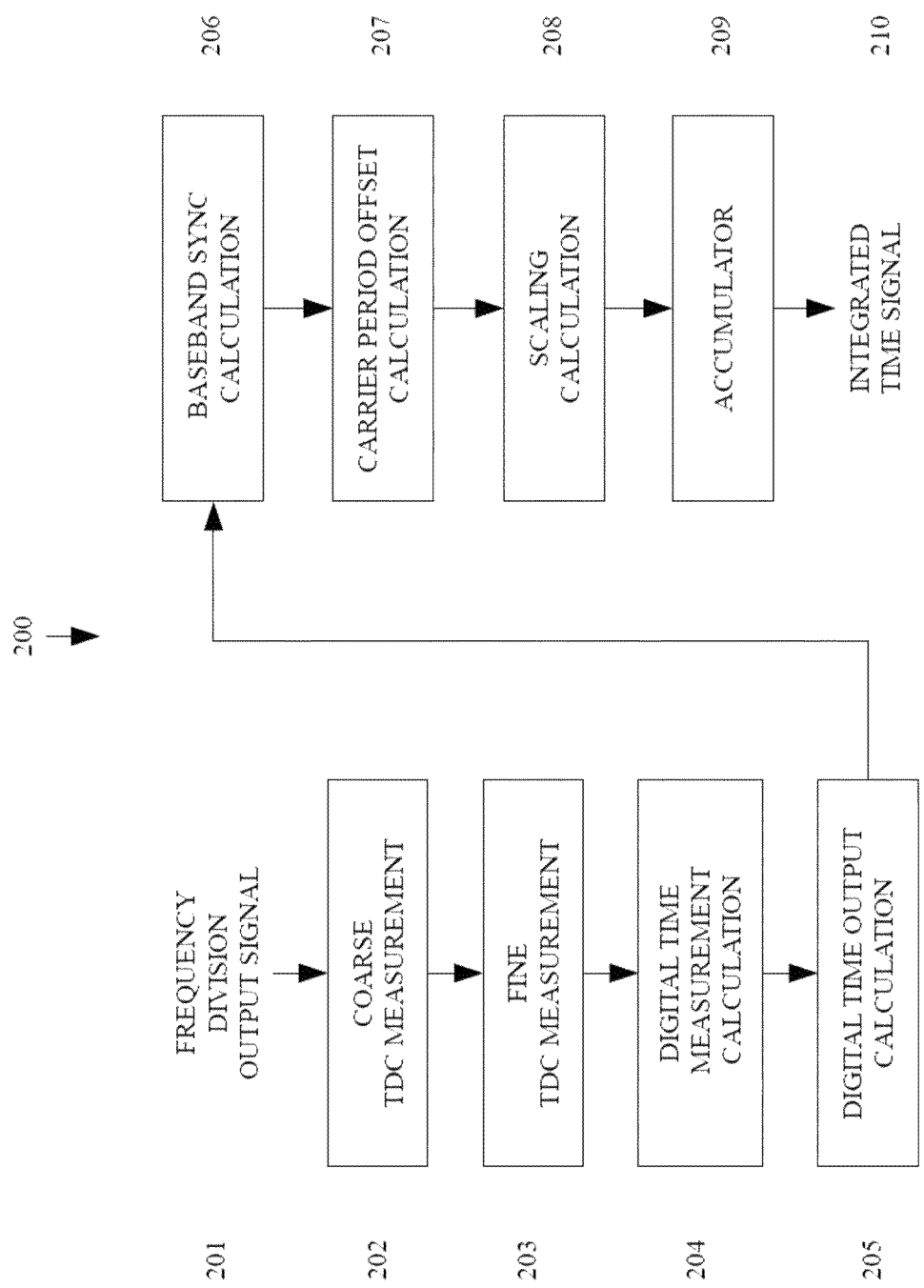
FIG. 2 is a flowchart of a detailed Time-to-Digital Conversion (TDC) method and post-processing actions according to some embodiments.

FIG. 2 is a block diagram of the processes executed to convert a time to a digital value and further calculate a phase of the original modulated signal. The frequency division output signal 201 corresponds to the input signal into the TDC block 116 shown on FIG. 1. In other embodiments, a frequency division operation is not used. The frequency division output signal is the input to the coarse TDC measurement block 202. The circuit calculates a coarse estimate of the elapsed time between a coarse measurement start signal and a coarse measurement stop signal. This coarse estimate may include an error amount due to the quantization size of the coarse measurement. The fine TDC measurement block 203 calculates an estimate of the error, and this error value is subtracted from the coarse measurement value with the coarse+fine measurement calculation 204. The digital time output goes into the digital time output calculation block 205 to check for wrapping of the value based on the maximum counter values used in the coarse measurement calculations. The system uses the output of this check to perform the 160 MHz baseband synchronization calculation 206. The polar receiver 100 uses phase calculations at certain times, and the 160 MHz baseband synchronization calculation compares the digital time output to a reference value corresponding to the 160 MHz baseband period. The output of the 160 MHz baseband synchronization calculation (integrated time output enable) is used to determine the appropriate time to read the integrated time signal 210. The offset digital time output calculation 207 subtracts the carrier period offset from the digital time output. The offset digital time output is scaled by the scaling calculation 208. The scaled digital time signal is accumulated by the accumulator circuitry 209. The integrated time signal 210 is read at the appropriate time based on the integrated time output enable.

Figure 3:
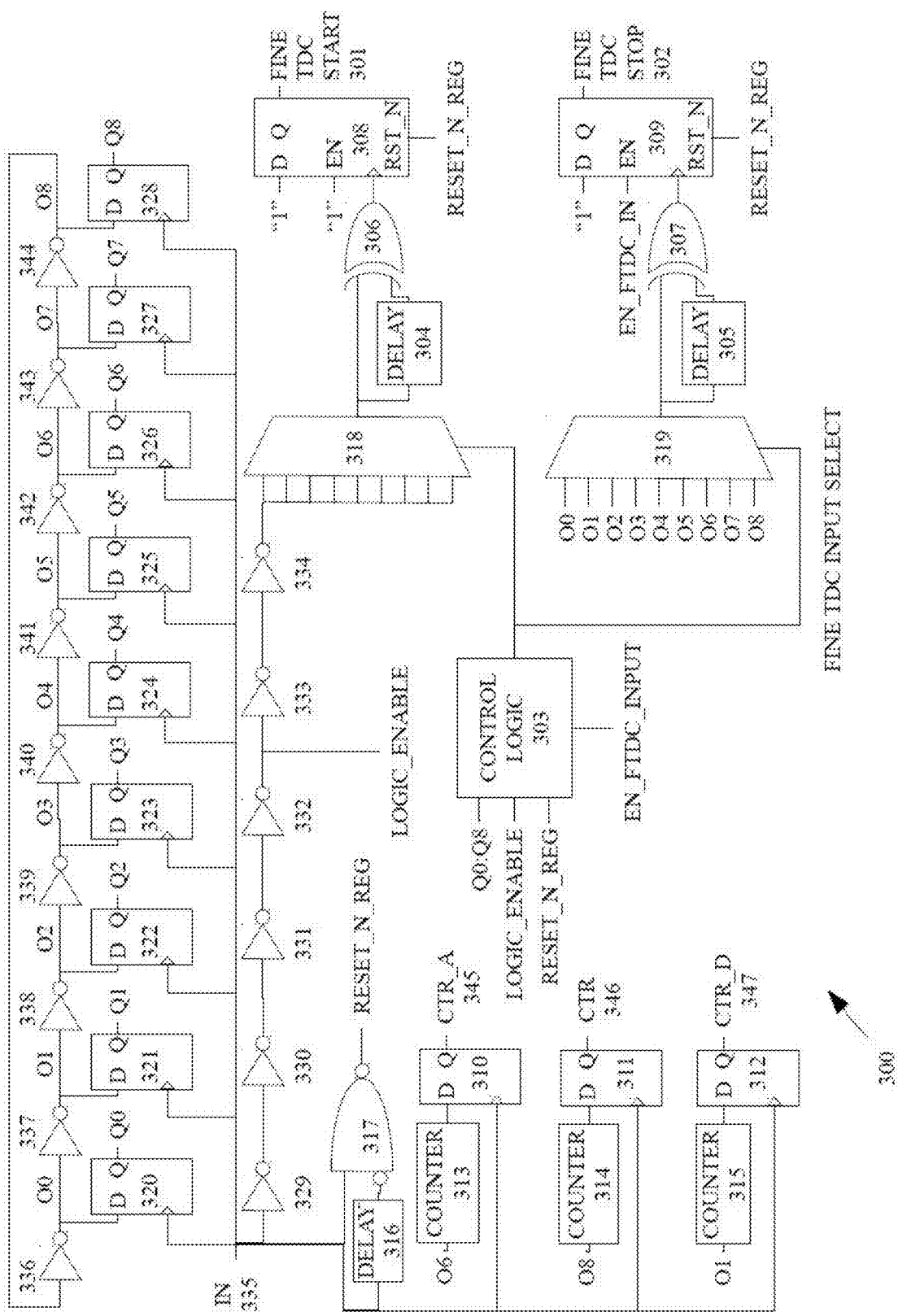
FIG. 3 is a block diagram of a coarse estimate for a TDC according to some embodiments.

FIG. 3 is the block diagram of an example coarse measurement circuit. The coarse estimate starts with a ring oscillator. FIG. 3 is an example embodiment where the ring oscillator contains nine inverting elements. Noting the inverse relationship between frequency and time, the ring oscillator's oscillation frequency is:

$$f_{RO} = \frac{1}{2*9*t_{delay,element}},$$

where $t_{delay\ element}$ is the delay of one of the nine elements of the ring oscillator. For some embodiments, the coarse measurement circuit may be a ring oscillator circuit with seven inverting elements. The oscillation frequency of the ring oscillator may be calculated as shown below for some embodiments:

$$f_{RO} = \frac{1}{2*7*t_{delay,element}}$$

where $t_{delay\ element}$ is the delay of one of the seven elements of the ring oscillator.

A modulated signal with a first and second rising edge is received at the input node 335. The first and second rising edge signals are elements of the modulated signal. At each rising edge, the TDC circuit latches the output values of each element forming a ring oscillator. Each element in the ring oscillator outputs an inverted version of its input signal. When the input changes state, it takes time for the output to reflect that change. The location of the propagation edge in the ring oscillator is the inverter stage where the input and output are in the process of moving to opposite states. The system counts the number of complete oscillations of the ring and combines it with the present state of the ring oscillator to calculate a coarse estimate of the period of the modulated signal. One example method to determine generally complete oscillations of the ring is to increment a counter each time a particular inverter changes state. This specification discusses in later sections both determination of complete oscillations of the ring and calculation of a coarse estimate. The resolution of the coarse estimate for one example embodiment is the length of delay of an inverter stage because the coarse estimate circuit does not probe into the internal circuit of the inverter.

Choosing the delay for each element of the ring oscillator to be a power of 2 times the fine TDC resolution may reduce the number of digital logic components used to combine the coarse and fine measurements. Minimizing the fine TDC's range may decrease power consumption. The delay of each element of the ring oscillator also sets the minimum range of the fine TDC. The fine TDC typically consumes more power than the coarse TDC, though for some embodiments, the fine TDC may consume less power than the coarse TDC. Picking a larger delay for each element in the ring oscillator may reduce the number of ring oscillator stages. Using a lower oscillation frequency may reduce power consumption. Also, picking a lower oscillation frequency allows the coarse TDC control logic to settle earlier in the ring oscillator cycle. Limiting the number of elements may reduce logic complexity and save circuit board layout space.

For one example receiver, these constraints and other factors (for example, cost and availability) led to a choice of $T_{delay\ element}$ equal to $2^5*5$ ps, which equals 32*5 ps or 160 ps. Hence, the frequency of the ring oscillator ($f_{RO}$) became 347.222 MHz.

FIG. 3's example embodiment connects the output of each ring oscillator inverter 336 to 344 into a D-flip-flop 320 to 328. The circuit uses the D-flip-flop outputs to store the state of each stage of the ring oscillator when the modulated signal has a rising edge. The circuit uses as the pulse-propagating inverter the inverter having a non-inverted latched output value. Depending on whether the ring oscillator is in the first half of an oscillation or the second half, the inverter of the ring's propagation stage may have its input and output both low or both high.

The example receiver circuit uses three counters 313 to 315 to record complete oscillations of the ring. Each of these counters connects to the output of a different stage in the ring. Because the rising edge of the modulated signal is asynchronous to the ring oscillator, the rising edge may arrive at any moment. Such an edge may occur at the same moment a ring oscillator stage counter updates. Using three counters makes sure a counter not in the process of updating will have enough settle time before probing it. One example embodiment uses the counter of a desired stage within the ring and two back-up counters two stages before and two stages after the desired measurement stage. Using counters positioned two delays apart allows the system to use stage outputs that will be in the same state after the propagation edge passes through both stages. Such a configuration ensures that at least two of the counters will be in the same state. The logic circuit for an example receiver picks which counter to use based on the location of the ring oscillator's propagation edge signal. If the propagation edge of the ring oscillator is currently at the same position as the desired counter, the logic uses one of the other two counters. Another example method may use a counter's value as the number of complete oscillations of the ring oscillator if it matches at least one other counter. Yet another example method may use a desired counter unless the propagation edge of the ring oscillator is at the same location of the desired counter or one position prior, in which case the system may use the back-up counter.

One embodiment may use two counters to count the number of complete oscillations of the ring oscillator. For this embodiment, a first counter is incremented when an output of a first inverter of the ring oscillator changes state. Likewise, a second counter is incremented when an output of a second inverter of the ring oscillator changes state. The circuit selects a count value from either the first or second counter based on the location of the pulse-propagating inverter in relation to the first and second inverters.

Using the position of the edge inside the ring oscillator, the system decides which of the three counters to use. For an example receiver, the counter at O1 (oscillator 1) has a count one more than the other two because its count is incremented as soon as the ring oscillator is enabled. If the edge is in the second half of the oscillation ring, the system may use the O1 counter 315 because the O1 counter has settled correctly. If the edge is in the first half of the oscillation ring, the system may use the O6 counter because the O6 counter has settled correctly. An exception occurs when the edge starts another oscillation and its position is 0. That position may be considered the first half of the oscillation, but sometimes the advanced counter (O6) 313 lacks enough time to settle. In those situations, the system selects the delayed counter (O1), but the +1 count may not be removed. Other embodiments may use different stage counters without changing the general principles.

Using ongoing counters avoids resetting the circuit after each coarse measurement. Each time a measurement is made, there is an error. Embodiments that accumulate the results in subsequent signal processing may accumulate those errors over a long time may become a large error and too big for the system to handle. Using a ring oscillator with ongoing counters allows the errors to cancel each other over a long period of time. The measurement error connects back directly into the system, and each new measurement remains within the resolution boundaries.

For some embodiments, a coarse phase measurement may be determined by determining a phase interval of a plurality of phase intervals of a local clock that coincides with a rising edge of a received modulated signal. A fine phase measurement error may be determined to be the error in the coarse measurement. A phase measurement may be obtained as the difference between the coarse phase measurement and the fine phase measurement error. For some embodiments, a phase interval may be determined according to a state of a plurality of ring oscillator elements. A coarse measurement circuit may include a plurality of ring oscillator elements.

For some embodiments, if the coarse TDC circuit takes a measurement, each of the ring oscillator's stages may be sampled to determine which two successive stage's D-flip-flop is in the same state, indicating that the corresponding stage of the ring is in transition. This determination is performed by control logic 303 based on D flip-flop (320-328) output signals Q0-Q8 in FIG. 3, or, in the embodiment shown in FIG. 13 by MUX control logic 1304 based on the ring oscillator phases 1328 latched by D flip-flops 1302. A phase measurement corresponding to the second D-flip-flop is used to generate a coarse phase measurement. In some embodiments, for nearly every rising edge of the Rx input signal, the ring oscillator is probed, and the signals to be sent to the fine time to digital conversion (FTDC) circuit are generated. Some rising edges of the Rx input signal may be skipped to maintain synchronization or to allow the TDC circuit to reset. The CTDC circuit also may generate start and stop signals for the FTDC circuit and increment a counter for how many RX input signal rising edges have been skipped (which may be denoted as "C<3:0>" or "C<6:0>"). The CTDC circuit may also determine in which of two cycles of the ring oscillator 640 MHz clock that a rising edge of the Rx input signal arrived (which may be communicated via a "B" signal).

Generating input signals for the fine measurement takes time for the control logic to read and process the state of the ring oscillator. When the modulated signal arrives with a rising edge, an example receiver changes the D-flip-flop outputs to match the output signal for each stage of the ring oscillator. A signal corresponding to a received modulated signal also goes through delay elements 329 to 334 corresponding to the circuit's processing time for determining the location of the propagating edge in the ring oscillator circuit. The signal corresponding to the modulated signal goes through six inverters 329 to 334 that correspond to the delay of six stages in the ring oscillator. The fine measurement circuit uses as its fine measurement start signal the modulated signal delayed through six inverters (329 to 334), a multiplexer 318, and associated signaling components (304, 306, and 308). For the fine measurement stop signal, the receiver uses the ring oscillator inverter output signal for six stages past the location of the propagation edge. The fine measurement circuit uses a multiplexer 319 to pick the appropriate ring oscillator inverter stage output signal for the fine measurement stop signal. The fine measurement stop signal propagates through a set of signaling components (305, 307, and 309) similar to the fine measurement start signal. The fine resolution measurement calculates the difference between the fine measurement start and stop signals.

In one embodiment, the fine measurement start signal for a Vernier comparator circuit is the rising edge of the modulated signal. The fine measurement stop signal is selected to provide a delayed coarse measurement signal to a Vernier comparator circuit using a control logic circuit and a multiplexer. In one embodiment, the control logic circuit controls the multiplexer to select a comparator located a predetermined number of delay elements past the pulse-propagating inverter. In one embodiment, initiating the Vernier comparator circuit using the rising edge of the delayed coarse measurement signal comprises delaying the rising edge signal by using a multiplexer and a predetermined number of delay elements.

For example, if the ring oscillator state corresponds to the propagation edge being inside stage one, using control logic 303, a delay 316, a NAND gate 317, and a multiplexer 319, the circuit selects the ring oscillator element corresponding to stage seven (six stages later). The output signal of multiplexer 319 is the fine measurement stop signal 302. The circuit also delays the coarse measurement start signal six stages to create the fine measurement start signal 301. An example receiver delays the modulated signal six delay stages to put the fine measurement start signal 301 in the proper time frame for use with the fine measurement stop signal 302. Both signals go through matched components prior to propagating through the fine measurement circuit. For one example receiver, those components are a multiplexer (318 and 319), an XOR gate (306 and 307), a delay element (304 and 305), and a D-flip-flop (308 and 309), as shown in FIG. 3. The delayed coarse measurement signal is processed by a delay element and an XOR gate to generate a trigger upon either a rising edge or a falling edge of the delayed coarse measurement signal. The delay element (304 and 305) and the XOR gate (306 and 307) create short pulses for the fine measurement start and stop signals. The short pulses connect into the clock signals of D-flip-flops (308 and 309). The D-flip-flops output high signals as long as the associated enable signal is high and reset signal is low. Hence, the fine measurement start and stop signals 301 and 302 are edge signals.

Figure 4:
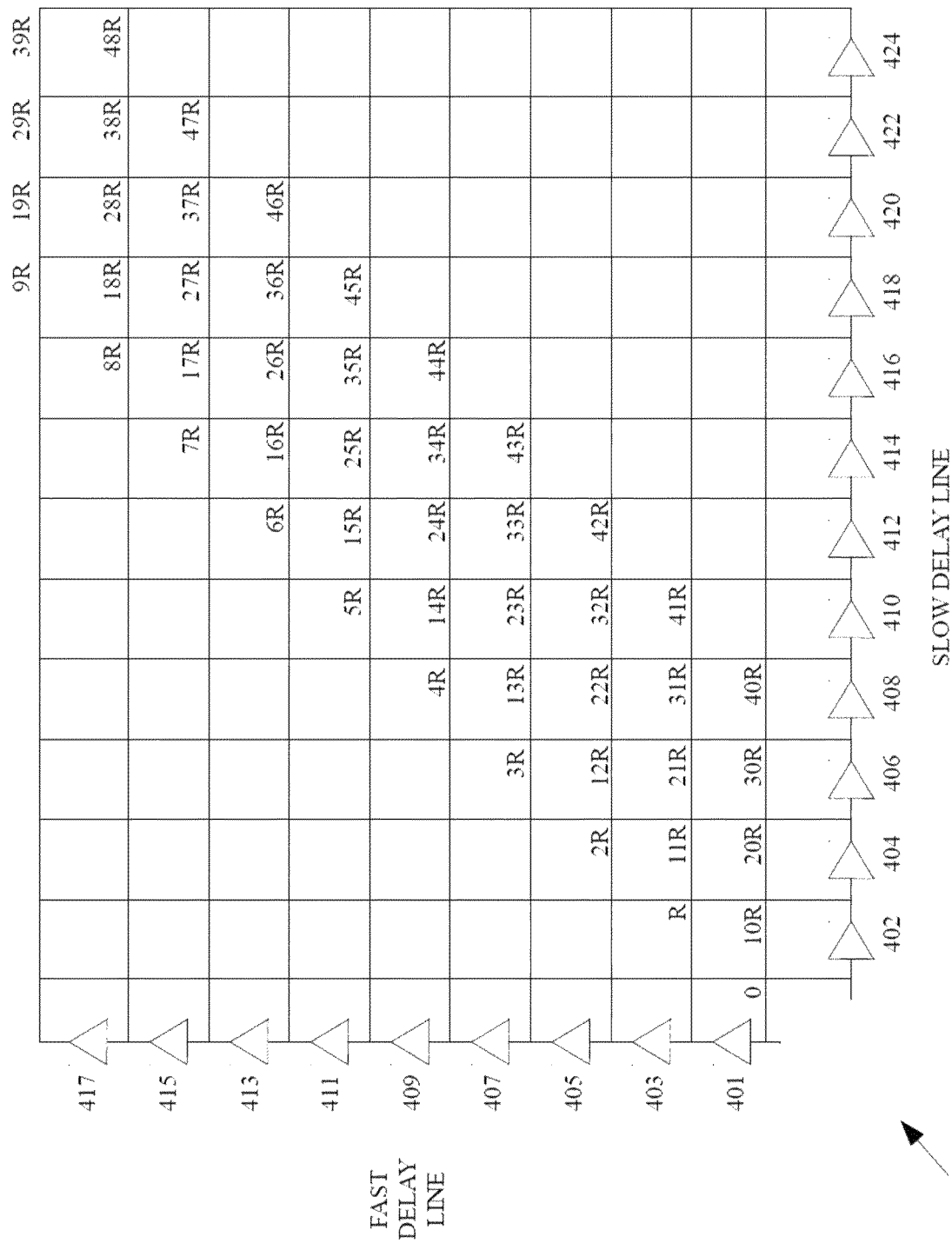
FIG. 4 is a block diagram of a two-dimensional Vernier time to digital converter according to some embodiments.

FIG. 4 is a graphical example of how the fine measurement two-dimensional Vernier works. The system uses the two-dimensional Vernier circuit to estimate the error of the coarse measurement. It uses two sets of delay lines: one fast delay line and one slow delay line. One embodiment uses a set of one or more inverters 401 to 424 for each of these delay lines. The fine measurement start signal progresses through the slow line, while the fine measurement stop signal travels through the fast line. For an example receiver, a matrix of SR latches compares the delay line intersections of interest. For one embodiment, the matrix's size is equal to the number of inverters in the fast delay line times the number of inverters in the slow delay line. Using an SR latch as the arbiter, each fast line inverter output is connected to the S input for a row of SR latches in the matrix. Each slow line inverter output is connected to the R input for a column of SR latches in the matrix. Each SR latch outputs a high signal if the S input goes high while the R input stays low. When no edge is propagating through the delay lines, all delay cell outputs stay low, and all arbiter outputs remain high. This configuration means that the output of the arbiter goes high when the associated fast line pulse arrives at the arbiter before the associated slow line pulse. The fine TDC circuit detects this condition where the fast line pulse arrives first. When the second rising edge reaches the arbiter, its output is on hold and the result is not affected. Resetting the delay lines also resets the arbiters.

In one embodiment, calculation of the fine resolution measurement of the coarse measurement error comprises propagating a rising edge of the modulated signal (fine measurement start signal) through a first line of delay elements. The delayed coarse measurement signal (fine measurement stop signal) propagates through a second line of delay elements, where the first line of delay elements is slower than the second line of delay elements. A matrix of arbiters form a two-dimensional Vernier structure. Using the matrix of arbiters, a fine measurement point is determined to be a smallest arbiter location at which the fine measurement stop signal arrives at the arbiter location before the fine measurement start signal. An arbiter location identifier is calculated as the time difference for a signal to propagate through the corresponding portion of the first line of delay elements and the corresponding portion of the second line of delay elements. A first arbiter location is determined to be smaller than a second arbiter location if the first arbiter's time difference is smaller than the second arbiter's time difference. One embodiment outputs the fine resolution measurement as the fine measurement point.

One example receiver uses a two-dimensional Vernier structure 400 as shown in FIG. 4. The receiver's two-dimensional Vernier structure uses twelve slow delay elements 402, 404, 406, 408, 410, 412, 414, 416, 418, 420, 422 and 424 (each with 50 ps of delay), nine fast delay elements 401, 403, 405, 407, 409, 411, 413, 415, and 417 (each with 45 ps of delay), five Vernier lines, and forty-nine arbiters.

The fast delay line uses inverters with a shorter delay than the inverters used in the slow delay line. For one example receiver, the fast delay line uses inverters 401, 403, 405, 407, 409, 411, 413, 415, and 417 with a delay of 45 ps. The slow delay line uses inverters 402, 404, 406, 408, 410, 412, 414, 416, 418, 420, 422 and 424 with a delay of 50 ps. At each intersection of interest in FIG. 4, there is a value written as a multiple of R. The letter "R" represents the difference in delay for one delay element from the fast delay line and one delay element from the slow delay line. For one example receiver, the difference between these values is 5 ps (50 ps minus 45 ps). Hence, for the receiver, R is 5 ps. The values shown at the intersections of interest range from zero to 48R. Replacing the R with a value of 5 ps, FIG. 5's two-dimensional Vernier structure may resolve measurement errors from zero (0R) to 240 ps (48R).

Consider the intersection near the center of FIG. 4 that says "24R." The inputs to the SR latch that correlates to this intersection travel through six elements of delay on the slow delay line and four elements of delay on the fast delay line. For one example receiver embodiment, the slow delay line input experiences a delay of 6*50 ps=300 ps. The fast delay line input experiences a delay of 4*45 ps=180 ps. The difference between these values is 120 ps. Dividing this value by 5 ps (the value for R), produces a value of 24R. One calculates the values shown at the intersections of interest in FIG. 4 using calculations similar to the ones shown in this example.

Figure 5:
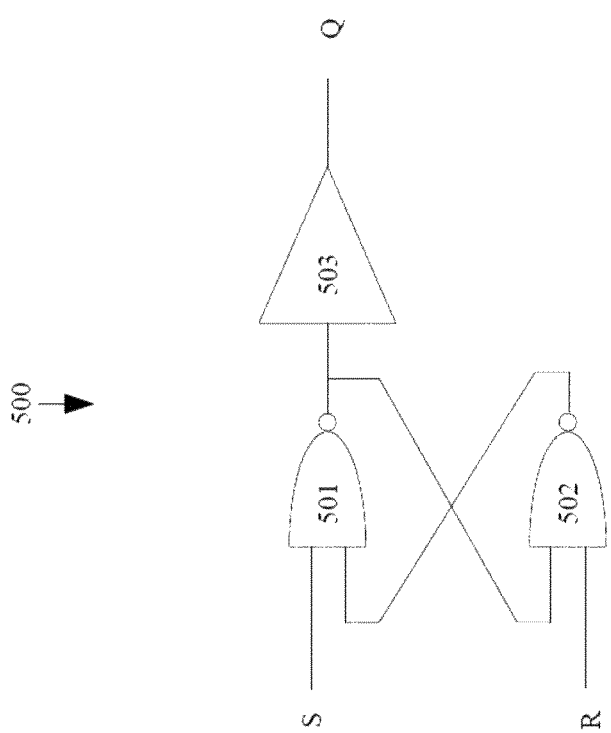
FIG. 5 is a block diagram of an arbiter circuit according to some embodiments.

At each intersection shown with an "R" label on FIG. 4, there is an arbiter circuit to determine if the signal from the slow delay or the signal from the fast delay line propagated through the location first. FIG. 5 is one embodiment of such an arbiter circuit. The fast delay line at an arbiter location connects to an S input, which connects to NAND gate 501. The slow delay line at an arbiter location connects to an R input, which connects to NAND gate 502. The output of NAND gate 501 connects as an input to NAND gate 502 and as input to amplifier 503. Likewise, the output of NAND gate 502 is an input to NAND gate 501. The output of the amplifier is a signal Q.

When S is the low state ("0") and R is in the high state ("1"), Q is in the high state ("1"). When both S and R are in the high state, Q retains the same value it had previously. If S is high and R is low, Q is in the low state. With no rising edge propagating through either the fast or slow delay lines, both S and R equal 0, so Q starts as a 1. If the rising edge of the slow delay line arrives first at the arbiter location, the arbiter output Q stays as a 1. If the rising edge of the fast delay arrives first at the arbiter location, the arbiter output Q changes to a 0.

To further explain how the two-dimensional Vernier structure works, consider an example where the edges for the fine measurement start and stop signals differ by 194 ps. For the 38R intersection, the fine measurement start signal going through the slow delay line travels through eleven slow delay elements, which corresponds to a delay of 550 ps (11*50 ps). The fine measurement stop signal going through the fast delay line travels through eight fast delay elements, which corresponds to a delay of 360 ps (8*45 ps). The difference in these two lines corresponds to 190 ps (550 ps minus 360 ps). The slow delay line propagation edge beats the fast delay line propagation edge to the input of the arbiter (an SR latch for an example receiver), and the arbiter's output for 38R remains high.

For the 39R intersection, the fine measurement start signal going through the slow delay line travels through eleven slow delay elements, which corresponds to a delay of 600 ps (12*50 ps). The fine measurement stop signal going through the fast delay line travels through nine fast delay elements, which corresponds to a delay of 405 ps (9*45 ps). The difference in these two lines corresponds to 195 ps (600 ps minus 405 ps). The fast delay line propagation edge arrives prior to the slow delay line propagation edge at the input of the arbiter, and the arbiter's output for 39R goes low. For the 40R and higher intersections, the fast delay line propagation edge arrives prior to the slow delay line propagation edge at the input of the arbiter, and each of those arbiter outputs also goes low.

For some embodiments, the fast delay line may have 16 delay elements with 75 ps of delay for each element, corresponding to a total delay of 1200 ps (16*75 ps). The slow delay line, with some embodiments, may have 18 delay elements with 80 ps of delay for each element, corresponding to a total delay of 1440 ps (18*80 ps). A two-dimensional Vernier delay structure may be used to resolve errors in multiples of R from 1 to 63 for R equal to 5 ps. Restated, the 2-D Vernier delay structure may be used to resolve errors in multiples of 5 ps from 5 ps to 315 ps with some embodiments.

Some embodiments for determining a fine measurement error may include injecting, into a slow line of two-dimensional Vernier delay elements, a rising edge of the modulated signal and injecting, into a fast line of two-dimensional Vernier delay elements, an output of the ring oscillator associated with the determined phase interval (a signal associated with the D-flip-flop in a state of transition). A fine measurement error may be determined using a matrix of arbiters connected between the slow line and fast line. A fine measurement point is a smallest arbiter location in which the coarse measurement signal propagating through the fast line of delay elements arrives at the fine measurement point before the rising edge of the coarse measurement signal propagating through the slow line of delay elements. A fine measurement error may be outputted corresponding to the fine measurement point.

A fine measurement error circuit, for some embodiments, may include a first set of one or more inverters forming a first line of delay elements, and a second set of one or more inverters forming a second line of delay elements, with the first line of delay elements being slower than the second line of delay elements. The fine measurement error circuit also may include a matrix of latches equal to the number of inverters in the first line of delay elements times the number of inverters in the second line of delay elements. A set of connections may connect each inverter output in the first line of delay elements to each first latch input in a column of the matrix of latches, and a set of connections may connect each inverter output in the second line of delay elements to each second latch input in a row of the matrix of latches. The matrix of latches may be used as the matrix of arbiters to determine the fine measurement point.

An example arbiter circuit (shown in FIG. 5) is used at each arbiter location. A Vernier two-dimensional structure circuit compares each arbiter location output with a low state and stores the lowest difference location (lowest multiple of R) where the fast delay line propagation edge signal arrived at the corresponding arbiter input before the slow delay line propagation edge signal. The system uses this lowest difference amount as the fine measurement.

The fine TDC resets after each measurement. When the edge propagating into the slow delay line reaches the end of the line, a reset pulse is generated. The reset pulse brings the fine measurement start and stop signals low, which propagates along the slow and fast lines. At the same time, this operation resets the arbiters.

Figure 6:
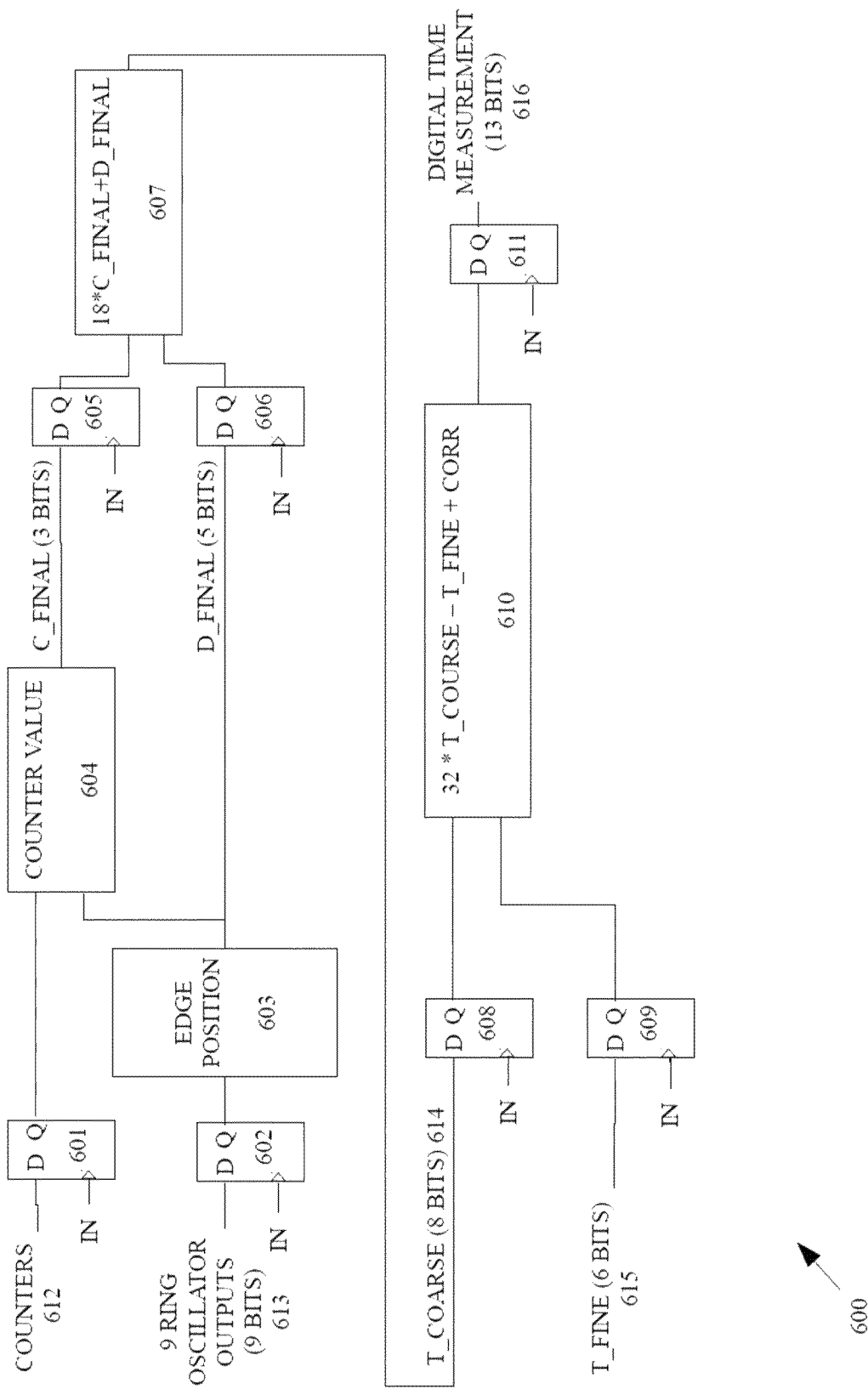
FIG. 6 is a block diagram of the combining of a coarse measurement and fine measurement according to some embodiments.

FIG. 6 is a block diagram of one embodiment of digital logic used to reconstruct the period of the TDC input from the coarse and fine measurements. The example coarse TDC circuit uses three counter outputs (345, 346, and 347) that connect as three counter signals 612 to three D-flip-flops 601. The output of each D-flip-flop connects to the counter value logic block 604. The counter value logic block outputs a coarse measurement and connects it to a D-flip-flop 605. The D-flip-flop's output connects to the coarse measurement logic block 607. The D-flip-flops create pipelined stages to provide for additional processing time, in other embodiments, pipeline stages are not used.

Nine D-flip flop outputs, stored as a nine-bit ring oscillator register value 613, hold the state of each stage in the ring oscillator. The nine-bit ring oscillator outputs register 613 connects to a D-flip-flop 602. The output of the D-flip-flop 602 connects to the edge position logic block 603. The edge position logic block calculates the location of the propagating edge in the ring oscillator circuit. The output of the edge position logic block connects to the counter value logic block 604 and to a D-flip-flop 606. The output of the D-flip-flop connects to the logic block 607.

The coarse measurement logic block 607 calculates the coarse measurement of the input period 614 and uses this value as the input to D-flip-flop 608. The output of the D-flip-flop is used as an input to the overall measurement logic block 610. The fine TDC measurement 615 is the input to D-flip-flop 609. The output of the D-flip-flop is an input to the overall measurement logic block 610 that calculates the overall measurement of the input period. The overall measurement of the input period is used as an input to a D-flip-flop 611. The output of the D-flip-flop is the digital time measurement 616.

Using the position of the edge and the correct counter output, the coarse measurement is obtained. For one example receiver, the ring oscillator contains 9 stages and 18 delay elements in a full oscillation cycle. Hence, the coarse TDC measurement is calculated as:

$$T_{coarse} = 18 * C_{final} + D_{final}.$$

The coarse TDC measurement is calculated as the time of a measured amount of complete oscillations of the ring ($18 * C_{final}$) plus a current propagation time ($D_{final}$).

The resolution of the coarse TDC is 160 ps, which is 32 times the fine TDC resolution. Hence, the digital time measurement is:

$$TDC_{OUTPUT} = 32 * T_{coarse} - T_{fine} + \text{Corr}.$$

A digital time measurement ($TDC_{OUTPUT}$) is calculated as a coarse measurement count ratio (32) times the coarse measurement time ($T_{coarse}$) minus the fine resolution measurement ($T_{fine}$) plus a calibration correction factor (Corr). The calibration correction factor depends on which edge the coarse TDC used to compute its value. Rising and falling edges have slightly different delays within the several gates, so a correction is applied to obtain an accurate result.

The predetermined number of delay elements equals the maximum coarse measurement logic processing time divided by a unit delay time of a ring oscillator delay element. For one example receiver, the predetermined number of delay elements is six. The multiplexer input select value equals the pulse-propagating inverter's stage position plus the predetermined number of delay elements. The multiplexer input select value is decremented by the total number of ring oscillator elements if the multiplexer input select value exceeds the total number of ring oscillator inverters. The coarse measurement count ratio is the unit delay time divided by the difference of a Vernier slow delay element and a Vernier fast delay element. For one example receiver, the coarse to fine measurement count ratio is $$\frac{160 \text{ ps}}{(50 \text{ ps} - 45 \text{ ps})} = 32.$$

FIG. 7 is a functional block diagram that shows the circuit blocks for calculation of the phase of the modulated signal based on the digital time measurement. The output of FIG. 6 for one example receiver is a 13-bit digital time measurement. This value serves as the input for FIG. 7. The first circuit block 701, 702, 703, 704, 705, 706, and 707 (digital time difference circuit) subtracts the previous digital time measurement from the present digital time measurement to calculate a period difference value. Circuit block 703 shows this calculation. If the previous digital time measurement exceeds the present digital time measurement, the digital time measurement wrapped past the maximum value. In such a situation, the circuit adds a counter wrapping value to the present digital time measurement and subtracts the previous digital time measurement. Circuit blocks 702, 704, and 705 show these calculations. The circuit in FIG. 7 delays one stage period the output of this difference calculation via, for example, a D-Flip-flop 707. For one example circuit, logic components 701 to 707 perform these comparisons and delay functions. For one example receiver, the wrap-over value is 4608. To calculate this limit, take the coarse counters' 8 possible values ($2^3$) times the 18 ring-oscillator stages times the coarse to fine measurement resolution ratio, 32. The result of this first circuit block is a period difference signal that is a difference in successive digital time measurements.

The second circuit block 708, 709, 710, 711, 712, 713, and 714 (baseband output time circuit) handles the baseband signal's 160 MHz read rate. The circuit block uses a feedback loop to add successive outputs of the first circuit block. If the successive additions exceed the output time threshold (1250), the output time threshold is subtracted from the feedback value and an output write signal goes high two stage periods later. The receiver uses the digital time output to reconstruct a 160 MHz timeline. The output time threshold (1250) corresponds to a 160 MHz read period with a 5 ps digital time output resolution value $$\left(\frac{1}{160\ \text{MHz} * 5\ \text{ps}}\right).$$

Every time the sum of consecutive periods exceeds 1250 (output time threshold), the baseband circuit samples the value. When such a condition occurs, the integrated time output enable 722 goes high two stages later, indicating an output time to write the phase of the modulated signal, the integrated time signal 723.

The third circuit block 715, 716, 717, 718, 719, 720, and 721 of FIG. 7 (offset digital time output circuit) handles subtracting a carrier period offset T from the first circuit block's output (digital time output) and scaling the result. The carrier period offset circuit subtracts off the carrier period offset for the offset digital time output calculation. The carrier period offset, T, is calculated as ($f_c$ is the carrier frequency):

$$T = \frac{8}{f_c * TDC_{resolution}}$$

The scaling circuit scales the offset digital time output to the desired level. The coarse TDC circuit accumulates the scaled digital time signal so that its error stays within the fine TDC measurement resolution. The scaling factor is calculated as:

Scaling factor=$1024 * f_c * TDC_{resolution}$.

The factor 1024 is because the phase $2\pi$ is mapped to 10 bits. An accumulating circuit accumulates a value as the final output of the phase demodulator circuit. The offset digital time output calculation and post-processing delay may be performed by circuit components 715 and 716. Scaling and post-processing delay may be performed by circuit components 717, 718, and 719. Accumulation of the scaled digital time signal and post-processing delay may be performed by circuit components 720 and 721 to output the integrated time signal 723.

One example receiver embodiment uses a FIFO to handle the baseband signal's 160 MHz read clock being asynchronous with the TDC circuit's output write clock of up to 400 MHz. The TDC circuit writes successive output values to a FIFO using a clock (TDC input signal) of up to 400 MHz at a rate set by the integrated time output enable signal 722, while the baseband circuit reads values at a rate of 160 MHz.

Figure 8:
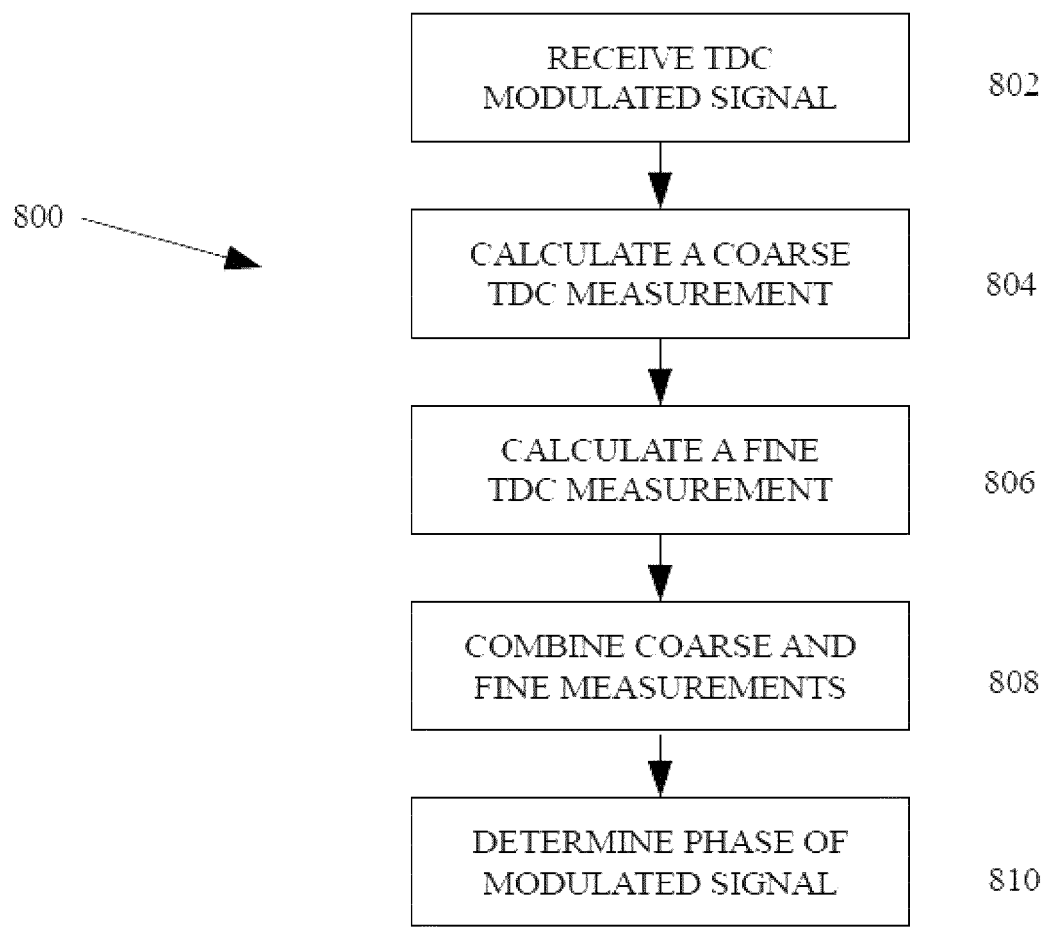
FIG. 8 is a flowchart of a TDC method according to some embodiments.

FIG. 8 is a method for calculating the phase of a modulated signal. The TDC method 800 via a reception process 802 receives a signal, which in some embodiments is a frequency division output signal. A course measurement process 804 uses the modulated signal to calculate a coarse measurement for the time to digital value conversion. The coarse measurement process 804 uses a ring oscillator of the TDC circuit to obtain a coarse measurement for the period between a first and a second rising edge of the modulated signal. A fine measurement process 806 calculates a fine measurement of the error in the coarse measurement. The fine measurement process 806 uses a Vernier comparator circuit of the TDC circuit to obtain a fine resolution measurement of a coarse measurement error. A combination process 808 combines the coarse and fine measurements to obtain a digital time measurement. A phase determination process 810 uses the digital time measurement to obtain the phase of the modulated signal.

Figure 9:
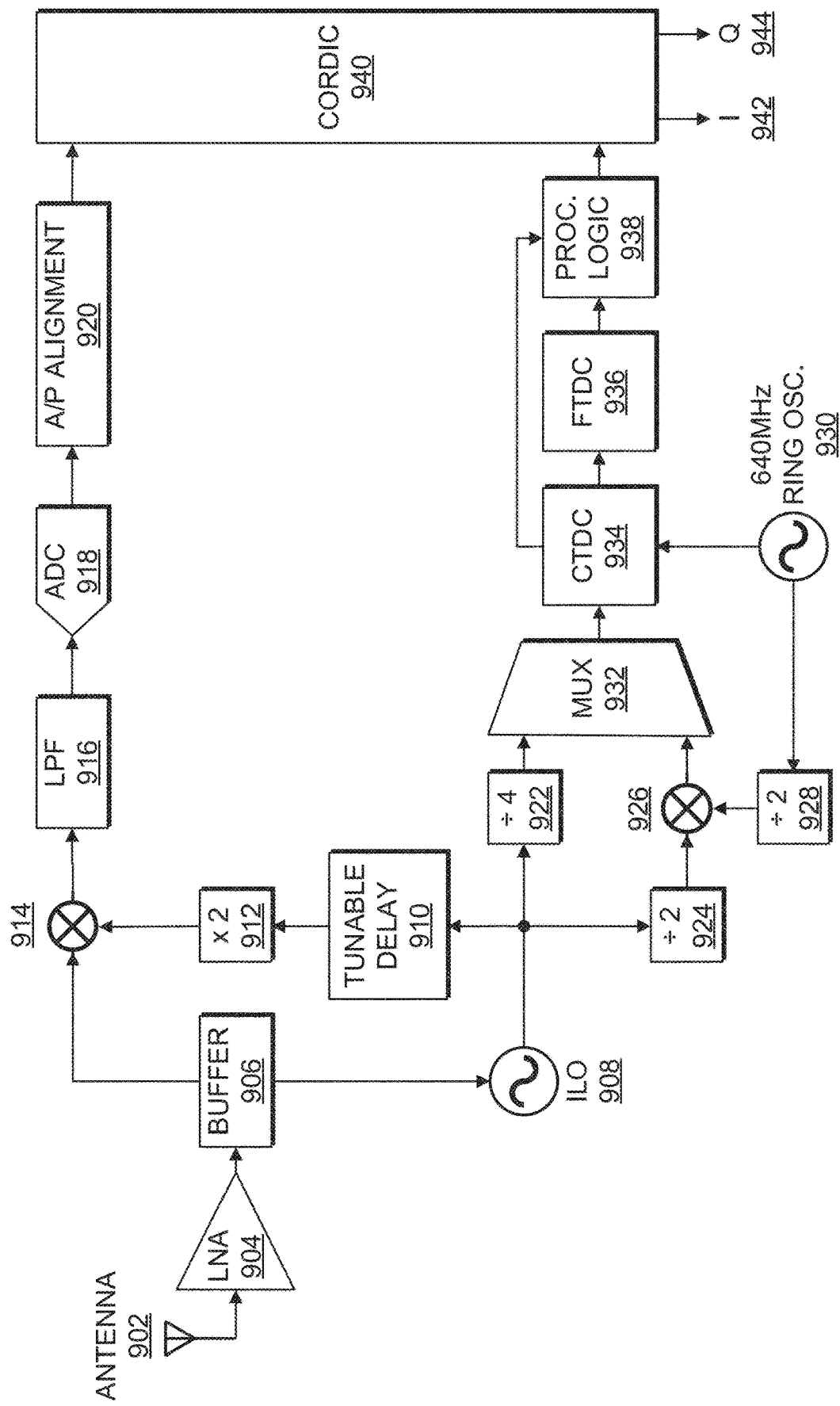
FIG. 9 is a schematic diagram illustrating an example receiver circuit according to some embodiments.

FIG. 9 is a schematic diagram illustrating an example receiver circuit 900 according to some embodiments. A modulated signal may be received by an antenna 902, which may be connected in some embodiments to a low noise amplifier (LNA) 904. The output of the LNA 904 may be connected to a buffer 906 and split into two lines of components to extract amplitude and frequency/phase information. For the frequency line of components, the received modulated signal may be processed by a harmonic injection lock oscillator (ILO) 908, thereby reducing the frequency of the received signal. The output of the harmonic ILO 908 may be connected to the inputs of a tunable delay 910, a divide-by-4 element 922, and a divide-by-2 element 924 for some embodiments. The output of the tunable delay 910 may be connected to an input of a divide-by-2 element to divide the frequency in half. The halved frequency signal may be mixed using a mixer component 914 with the modulated signal outputted by the buffer 906 for the amplitude line of components. The output of the mixer 914 may be filtered by a low pass filter (LPF) 916 to remove higher frequency components. The output of the LPF 916 may be received by an input to the analog-to-digital (ADC) 918 to convert the signal into a digital word representing the amplitude of the modulated signal. The output of the ADC 918 is aligned with the phase component of the modulated signal by an amplitude and phase alignment circuit 920 to align amplitude and phase components of the modulated signal. The output of the amplitude and phase alignment circuit 920 may be connected to the CORDIC 940.

Various circuits may be used to convert the modulated signal to a lower frequency for further processing. Some embodiments may have a divide-by-4 circuit that includes a divide-by-4 component 922. Some embodiments may have a divide-by-4 circuit that includes a divide-by-2 component 924, a mixer component 926, and another divide-by-2 component 928. Some embodiments may have a divide-by-4 circuit that includes a divide-by-4 component 922, a divide-by-2 component 924, a mixer component 926, and another divide-by-2 component 928, and a multiplexer (MUX) 932 to select an output of a divide-by-4 circuit. For a divide-by-4 circuit that includes a divide by 4 component, the frequency and phase components of the received signal are divided by 4. With some embodiments of a divide-by-4 circuit, the frequency and phase components of the received signal are divided by 2 by a divide-by-2 component 924. A frequency oscillator 930 may be used to generate a 640 MHz signal, which may be divided in half by a first divide-by-2 component 928. The output of the first divide-by-2 component 928 may be mixed with the output of a second divide-by-2 component 924 using a mixer 926. Use of a mixer may be used to alter the frequency component and preserve the phase component because a mixer shifts the frequency but does not change the phase. The output of the divide-by-4 circuit (which may be the output of a MUX 932 for some embodiments) may be received by a coarse time-to-digital conversion (CTDC) circuit 934. For some embodiments, the modulated signal may be processed to reduce the frequency using a divider circuit, such as a divide-by-4 component 922, for example. For some embodiments, the modulated signal may be processed to reduce the frequency using a mixer circuit, such as a mixer 926, for example.

For some embodiments, one or more of the following two types of frequency reduction may be used: (1) physically dividing the input signal with a frequency divider component, and (2) mixing an input signal with another frequency (such as a local oscillator (LO)) signal. Some embodiments may use an ILO to harmonically lock the frequency of the received signal. A second-harmonic or fourth-harmonic ILO may be used. The ILO output may be divided by a physical divide by 4 circuit. Some embodiments may divide the frequency by 8. Some embodiments may divide the frequency of the ILO output by 2 and mix the divided output with a 320 MHz signal. Some embodiments may divide the frequency by 8 using a physical divide-by-4 circuit and a mixer.

If the frequency is divided with a physical divider component, the phase also is divided. Using a mixer to mix an input signal with a sinusoidal signal may change the frequency but the phase is not changed (or divided). The spectrum (the bandwidth) of the input signal may be the same as the output signal for a mixer for some embodiments. With some embodiments, a divide by 8 circuit may have a resolution of 5 ps for the divided output signal. If the divided signal is later multiplied by 8, and the resolution may become 40 ps.

The CTDC circuit 934 may include a ring of components forming a ring oscillator, or in an alternative embodiment, a system clock having multiple phases may be used by the CTDC. The CTDC determines a coarse measurement of a phase measurement between the modulated signal and a local clock signal (or ring oscillator). For some embodiments, the local clock signal may be a 640 MHz signal, and the modulated signal may be between 280 to 320 MHz (or 160 MHz to 320 MHz for some embodiments). The CTDC circuit 934 may receive an output of the 640 MHz ring oscillator component 930. The output of the CTDC circuit 934 may be used by a fine time-to-digital (FTDC) circuit 936 to determine a fine measurement error. The processing logic circuit 938 may combine the coarse measurement and the fine measurement error to generate a phase measurement. A carrier-based phase correction value may be subtracted from the phase measurement to generate a corrected phase measurement. The corrected phase measurement may be scaled to generate a carrier phase measurement, which may be received by the CORDIC 940. The CORDIC 940 may receive the outputs of the amplitude and the frequency/phase lines of components to generate in-phase (I) 942 and quadrature (Q) 944 components of the modulated signal.

Figure 10:
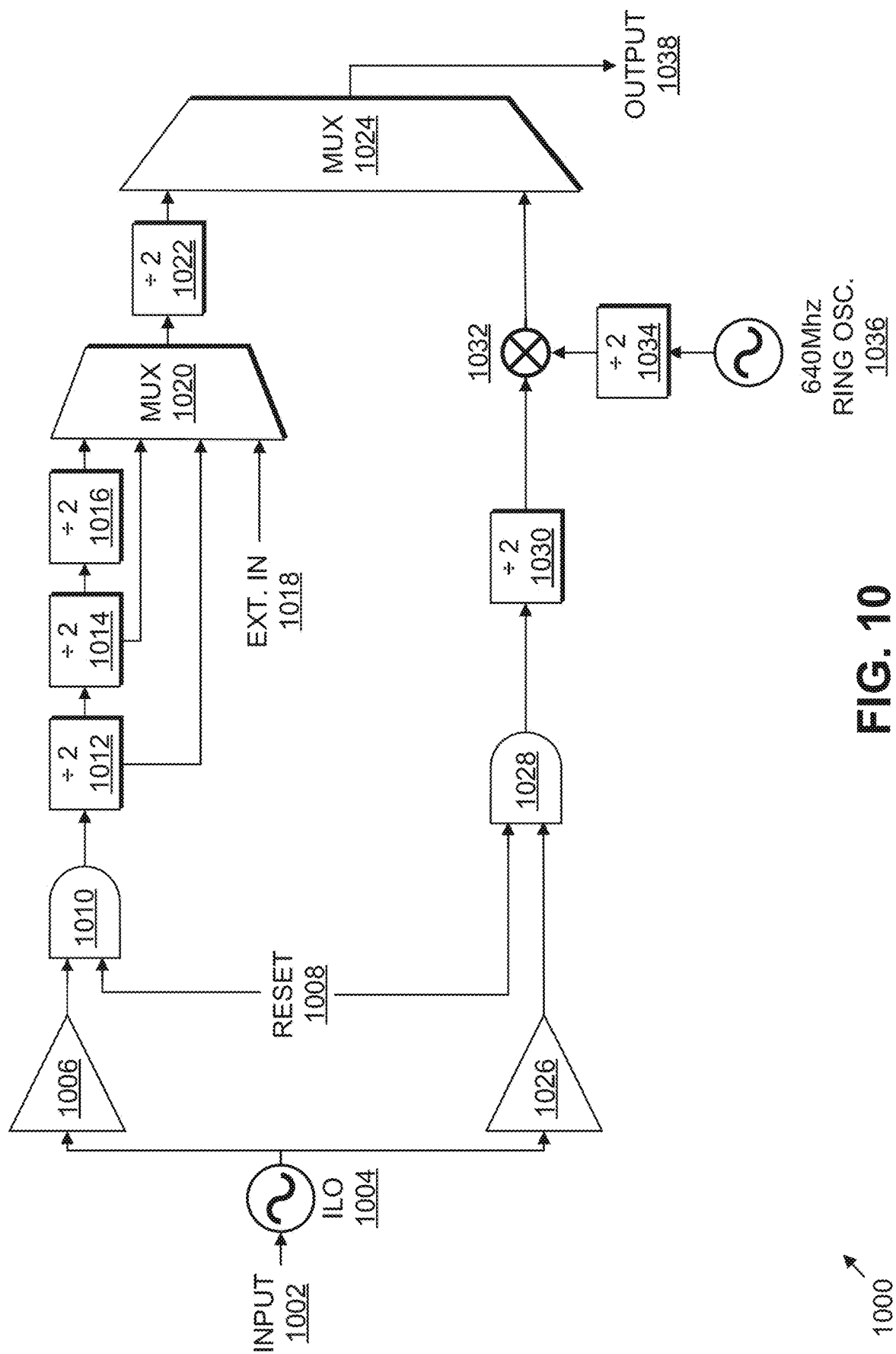
FIG. 10 is a schematic diagram illustrating an example frequency processing circuit of a receiver according to some embodiments.

FIG. 10 is a schematic diagram illustrating an example frequency processing circuit 1000 of a receiver according to some embodiments. The circuit of FIG. 10 provides a number of alternative signal processing paths that may be used to select a desired frequency division and/or down-conversion factor. In some embodiments, a single processing path may be provided where less configurability is desired. An input modulated signal 1002 may be injected into an injection-locked oscillator 1004 to reduce the frequency of the input signal. For some embodiments, the frequency-reduced signal may be inputted into a first buffer 1006 and a second buffer 1026. The output of the first buffer 1006 may be logically AND-ed with a reset signal 1008 using a logic AND gate 1010. The frequency of the AND gate's 1010 output signal may be divided by a series of divide-by-2 components 1012, 1014, 1016 to generate divide-by-2, divide-by-4, and divide-by-8 signals that may be inputted into a MUX 1020. An external input signal 1018 also may be inputted into the MUX 1020. The output of the MUX 1020 may be divided by a divide-by-2 component 1022 and inputted into a second MUX 1024. The output 1038 of the second MUX 1024 may be inputted into the TDC circuit.

The output of the second buffer 1026 may be logically AND-ed with a reset signal 1008 using a logic AND gate 1028. The frequency of the AND gate's 1028 output signal may be divided by 2 by a divide-by-2 component 1030. The output of the divide-by-2 component 1030 may be mixed with a 320 MHz signal using a mixer 1032. The 320 MHz signal may be generated by dividing a 640 MHz signal with a divide-by-2 component 1034. The 640 MHz sinusoidal signal may be generated by an oscillator 1036. The output of the mixer 1032 may be inputted into a MUX 1024. The MUX 1024 may be used to select between a divider circuit and a mixer circuit to generate an output signal 1038.

Figure 11:
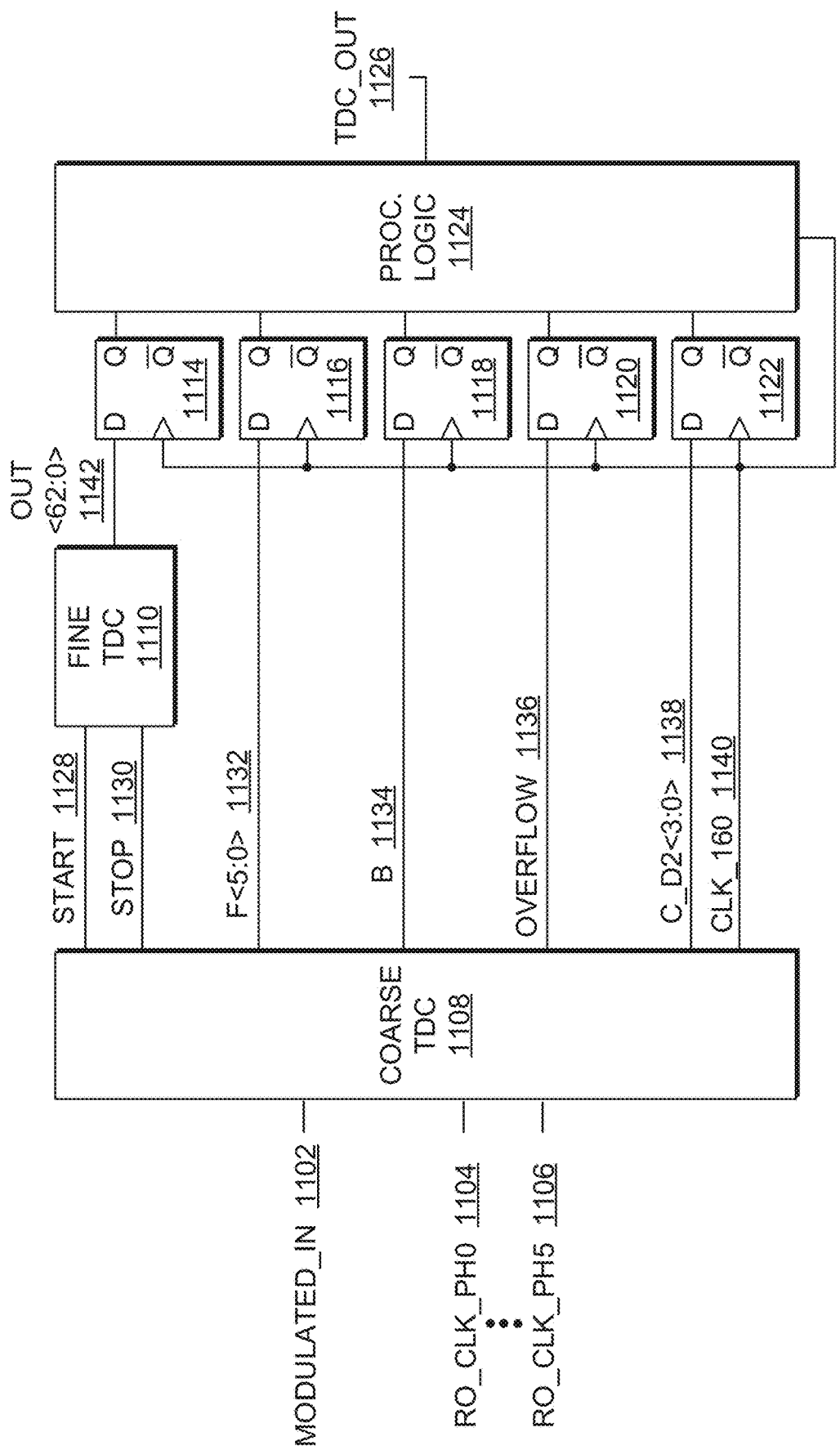
FIG. 11 is a schematic diagram illustrating an example process overview to generate a TDC output signal according to some embodiments.

FIG. 11 is a schematic diagram illustrating an example process overview 1100 to generate a TDC output signal according to some embodiments. A modulated input signal 1102 and a series of ring oscillator phase signals 1104, 1106 may be input into the coarse TDC circuit 1108. For some embodiments, the coarse TDC circuit 1108 may output start 1128 and stop 1130 signals for the fine TDC circuit 1110. The fine TDC circuit 1110 may output an output signal 1142, which may indicate one of 63 arbiter locations (labeled as "OUT<62:0>" in FIG. 11) for some embodiments. The coarse TDC circuit 1108 may output the ring oscillator state 1132, which is labeled as "F<5:0>". The ring oscillator state 1132 may be a coarse phase measurement that maps the modulated input signal 1102 to the closest phase sector selected from 6 phase sectors (or 12 phase sectors for some embodiments) of the ring oscillator clock signal (which may be a 160 MHz signal for some embodiments). The ring oscillator's clock signal may be delayed for two cycles to generate a "B" signal 1134, which may be used to determine if a rising edge of the modulated input signal occurred within two periods of a rising edge of the 640 MHz clock signal. An overflow signal 1136 may be generated by the coarse TDC circuit to indicate an overflow condition. The coarse TDC circuit 1108 may output a count of the number of rising edges of the modulated signal occurring (or skipped) since the last valid modulated input signal rising edge, in which the count is labeled as the "C_D2<3:0>" signal 1138. The coarse TDC circuit 1108 may also output a ring oscillator clock signal (labeled as "CLK_160") 1140.

For some embodiments, the arbiter output signal 1142, the ring oscillator state signal 1132, the "B" window signal 1134, the overflow signal 1136, and the count 1138 of modulated signal rising edges since the last valid measurement may each pass through a respective D flip-flop 1114, 1116, 1118, 1120, 1122 that may be controlled by a local clock signal 1140. The use of the respective D flip-flops 1114, 1116, 1118, 1120, 1122 may be used to synchronize the inputs to the processing logic circuit 1124 based on the ring oscillator clock signal 1140. The outputs of each respective D flip-flop 1114, 1116, 1118, 1120, 1122 may be input into the processing logic circuit 1124 and processed to generate a TDC output signal 1126.

Figure 12:
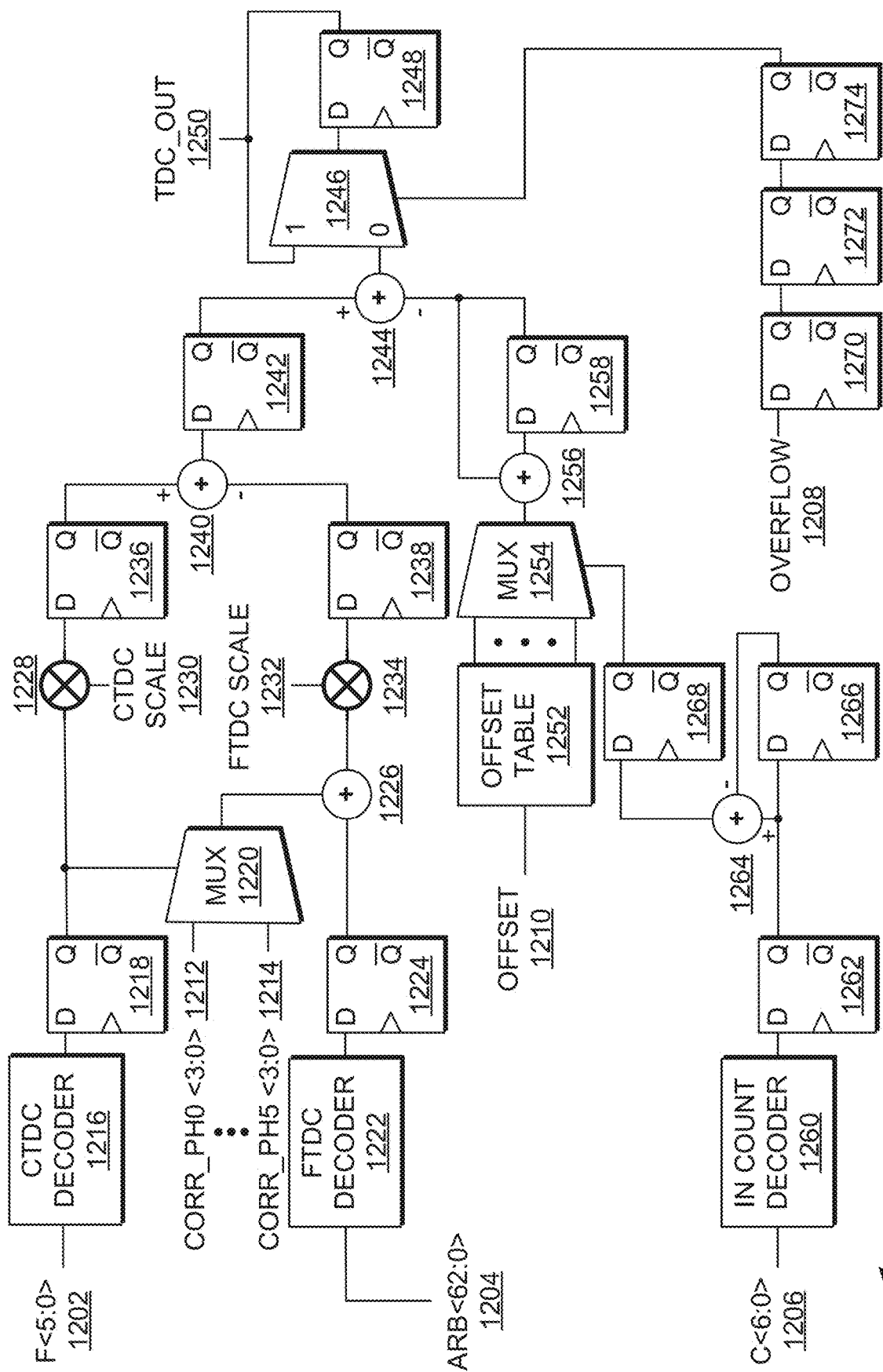
FIG. 12 is a schematic diagram illustrating an example TDC generation circuit according to some embodiments.

FIG. 12 is a schematic diagram illustrating an example TDC generation circuit 1200 according to some embodiments. Some embodiments may have a coarse time to digital conversion (CTDC) circuit that receives an Rx modulated signal. The CTDC circuit output may be a coarse measurement phase signal that is later scaled. The CTDC circuit also may output a coarse time signal that is received by the fine time to digital conversion (FTDC) circuit. The FTDC circuit may output a time signal that is scaled and subtracted from the scaled CTDC output signal.

Some embodiments may have a coarse time to digital conversion (CTDC) circuit that receives an Rx modulated signal and a 640 MHz local oscillator signal (or a 600 MHz for some embodiments). The CTDC circuit outputs a phase signal that corresponds to a phase sector. The CTDC circuit also outputs start and stop signals that are received by the fine time to digital conversion (FTDC) circuit. The FTDC circuit may include a 2D Vernier to calculate time signals. A scaling circuit receives the CTDC phase output signal, the FTDC time output signals, and a local oscillator signal. The scaling circuit outputs a phase signal.

In one embodiment, the phase of the ring oscillator's clock signal may be divided into 12 sectors corresponding to 360 degrees (or $2\pi$ in radians) divided by 12. The corresponding CTDC output is a binary representation of an integer 1 through 12, indicating which phase of 12 possible phases was aligned with the transition of the modulated signal. For some embodiments, the coarse TDC phase resolution scaling factor 1230 may be as shown below:

$$\text{CTDC\_SCALE} = \frac{2\pi}{12 \text{ sectors}} * \frac{2^{10 \text{ bits}}}{2\pi}$$

Figure 15:
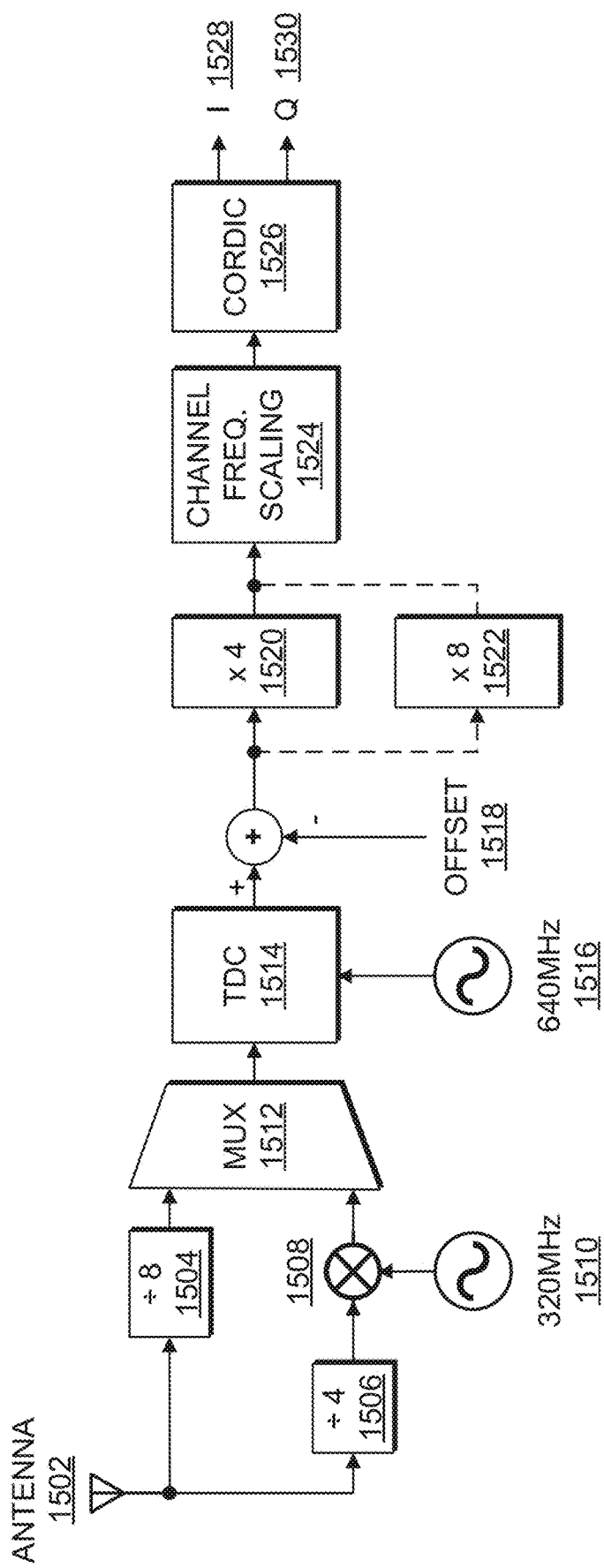
FIG. 15 is a schematic diagram illustrating an example phase demodulation circuit including a frequency scaling circuit according to some embodiments.

A CTDC signal may be multiplied by CTDC_SCALE 1230 using a multiplier 1228. Some embodiments of CTDC_SCALE 1230 may be multiplied by 4 or 8 to account for a division of 4 or 8 of the modulated input signal before the input to the CTDC circuit. For example, FIG. 15 shows multiplication by 4 (1520) and by 8 (1522) that may occur after the CTDC and FTDC circuits generate a phase measurement for some embodiments. With some embodiments, multiplication by 4 or by 8 may occur via CTDC_SCALE 1230 within the TDC. Some embodiments may include a multiplication by 2 within the value for CTDC_SCALE 1230 to account for a divide-by-4 circuit prior to the TDC circuit and a multiply-by-8 circuit after the TDC circuit.

FIG. 12 shows a coarse measurement input ("F<5:0>") 1202 received by a CTDC decoder circuit 1216. A fine measurement error input ("ARB<62:0>") 1204 is received by an FTDC decoder circuit 1222 and indicates for some embodiments which of 63 arbiters corresponds to a fine measurement point. The FTDC decoder 1222 outputs a binary value representing the time duration corresponding to the associated arbiter location. The time value outputs from the CTDC decoder 1216 and the FTDC decoder 1222 each connect to storage elements 1218, 1224 to store the time values provided by the decoders 1216, 1222, respectively, representing the coarse and fine time measurements. A correction factor 1212, 1214 may be added via an adder 1226 to the FTDC decoder output signal. The correction factor 1212, 1214 may be selected using a MUX 1220 with a coarse measurement signal connected to a selection pin of the MUX 1220. The correction factors may be obtained during a calibration procedure to account for errors associated with timing differences between the specific corresponding stages of the ring oscillator (or local clock phases).

The corrected FTDC signal may be multiplied by a fine TDC scaling factor 1232 using a multiplier 1234, which is shown below:

$$\text{FTDC\_SCALE} = \frac{2\pi}{3.125 \text{ ns}} * \frac{2^{10 \text{ bits}}}{2\pi} * TDC_{RES}$$

Two cycles of the 640 MHz clock, which correspond to a total time of 3.125 ns $$\left( = 2 * \frac{1}{640 \text{ MHz}} \right),$$

may be divided into $2^{10}$ segments for a fine measurement error expressed as a 10-bit word. Multiplying the fine measurement error by FTDC_SCALE 1232 converts the fine measurement error from time to phase.

The scaled coarse measurement and scaled fine measurement error may each connect to storage elements 1236, 1238 to preserve the scaled coarse and fine measurements for further processing. The scaled measurements may be combined with an adder 1240 to subtract the fine measurement error from the coarse measurement to generate a phase measurement. The phase measurement signal may go through a storage element (or D-flip-flop) 1242.

For some embodiments, obtaining a phase measurement may include determining a coarse measurement by determining a phase interval of a plurality of phase intervals of a local clock that coincides with a rising edge of the modulated signal. A fine measurement error of the coarse measurement may be determined, and a phase measurement may be determined by combining the coarse measurement and the fine measurement error. With some embodiments, a phase-to-digital (PDC) circuit may include a coarse measurement circuit configured to determine a coarse measurement by determining a phase interval of a plurality of phase intervals of the local clock that coincides with a rising edge of the modulated signal. The PDC circuit also may include a fine measurement error circuit coupled to the coarse measurement circuit and configured to determine a fine measurement error of the coarse measurement. The PDC circuit also may include a phase measurement circuit coupled to the fine measurement circuit and configured to determine the phase measurement by combining the coarse measurement and the fine measurement error.

With some embodiments, combining the coarse measurement and the fine measurement also may include scaling the coarse measurement by a coarse measurement scaling factor and scaling the fine measurement by a fine measurement scaling factor. Some embodiments of an apparatus may include a coarse measurement scaling circuit coupled to the coarse measurement circuit and configured to scale the coarse measurement by a coarse measurement scaling factor; and a fine measurement scaling circuit coupled to the coarse measurement scaling circuit and configured to scale the fine measurement error by a fine measurement scaling factor.

In some embodiments, scaling the coarse measurement may convert the coarse measurement from an index of the phase interval to a phase angle value and scaling the fine measurement may convert the fine measurement error from a time value to a phase with respect to the local clock signal (which may be a 320 MHz signal for some embodiments). With some embodiments of an apparatus, the coarse measurement scaling circuit may use the coarse measurement scaling factor to convert the coarse measurement from an index of the phase interval to a phase value, and the fine measurement scaling circuit may use the fine measurement scaling factor to convert the fine measurement error from a time value to a phase with respect to the local clock signal.

An offset 1210 may be calculated as the amount of phase shift subtracted from a phase measurement for every TDC input because the modulated input signal is not an exact multiple of a local clock (160 MHz for some embodiments). For some embodiments, an offset 1210 may be calculated as:

$$\text{Offset} = \left(\frac{8}{f_c} - 3.125 \text{ ns}\right) * \frac{1024}{3.125 \text{ ns}}$$

to account for the difference in period between two cycles of a local 640 MHz clock and the period of the modulated signal, with $f_c$ equal to the channel frequency of the modulated signal. For some embodiments, $f_c$ may be between 280 MHz and 320 MHz, while some embodiments may have $f_c$ between 160 MHz and 320 MHz. The value of Offset represents an expected change in time between a rising edge of the local clock and each successive rising edge of an unmodulated carrier at frequency $f_c$ due to the frequency difference between the local clock and the carrier. As described below, a table may be used to store multiples of the Offset value. Some embodiments of FTDC_SCALE 1232 may be multiplied by 4 or 8 to account for a division of 4 or 8 of the modulated input signal before the input to the FTDC circuit. For example, FIG. 15 shows multiplication by 4 (1520) and by 8 (1522) that may occur after the CTDC and FTDC circuits generate a phase measurement for some embodiments. With some embodiments, multiplication by 4 or by 8 may occur via FTDC_SCALE 1232 within the TDC. For some embodiments, CTDC_SCALE 1230, FTDC_SCALE 1232, and the offset 1210 may be multiplied by a factor of 2 to account for a divide-by-4 circuit prior to the TDC circuit and a multiply-by-8 circuit after the TDC circuit.

An apparatus may generate a phase correction increment, which may be based on (i) a count of periods of the modulated signal occurring between each generation of a corrected phase measurement (such as TDC_OUT 1250), and (ii) a difference between the carrier frequency and a frequency of a local clock signal. For some embodiments, an offset table 1252 (or phase correction table) may be used such that the phase correction increment is calculated as:

Phase Correction Increment=Offset*[in_count(i)−in_count(i−1)]

The offset 1210 may be calculated as described above, and the in_count( ) values may be calculated as described below. An offset table 1252 with an input for the offset 1210 may be used in combination with a MUX 1254 to select the phase correction increment. For some embodiments, a carrier-based phase correction circuit may include a lookup table, such as the offset table 1252, for example.

A count ("C<6:0>") 1206 of rising edges of the received modulated signal that occur between valid corrected phase measurement value is received by an in count decoder 1260. The output of the in count decoder 1260 may not be updated if an overflow condition occurs. The output of the in count decoder 1260 is connected to a storage element 1262. The previous in count value is subtracted from the current in count value using a delay element 1266 and an adder 1264 to generate an in count difference value. The in count difference value may be preserved in a storage element 1268. The in count difference value may be connected to a select line of MUX 1254 to select a phase correction increment from an offset table 1252. Stated another way for some embodiments, a count of periods of the modulated signal may be used to control a multiplexer to select a table entry storing a multiple of a single period carrier offset value. The selected phase correction increment provided, in some embodiments, by MUX 1254, may be added by adder circuit 1256, to an accumulation of previous phase correction increments, stored in register 1258, to generate a carrier-based phase correction value, which is then stored again in register 1258.

The carrier-based phase correction value may be subtracted from the phase measurement using an adder 1244 to generate a corrected phase measurement value. An overflow signal 1208 may be connected to a series of register elements 1270, 1272, 1274. If an overflow signal is equal to 1 (indicating an overflow condition), the select line of a MUX 1246 may select the previous corrected phase measurement (TDC_OUT 1250) retained using a D-flip-flop 1248 as the TDC output value.

Some embodiments may include obtaining a plurality of phase measurements of a local clock associated with signal transitions of a carrier having a carrier frequency and a phase-modulation component; generating an adjusted local clock phase measurement by subtracting an offset based on a frequency difference between the carrier frequency and a frequency of the local clock; and generating a phase modulation value by scaling the adjusted local clock phase measurement based on a ratio between the carrier frequency and the frequency of the local clock.

A method, for some embodiments, may include: receiving, at a receive phase-to-digital conversion (PDC) circuit, a modulated signal having a carrier frequency; obtaining a phase measurement between the modulated signal and a local clock signal; generating a carrier-corrected phase measurement by subtracting a carrier-based phase correction value from the phase measurement; and generating a carrier phase measurement by scaling the carrier-corrected phase measurement.

For some embodiments, a method may include: receiving, at a receive phase-to-digital conversion (PDC) circuit, a modulated signal having a carrier frequency; obtaining a local oscillator (LO) phase measurement as the difference between the modulated signal and an LO; generating a carrier-based phase correction value by accumulating a phase correction increment; generating a corrected phase measurement value by subtracting the carrier-based phase correction from the LO phase measurement; and scaling the corrected phase measurement value by a channel scaling factor.

Figure 13:
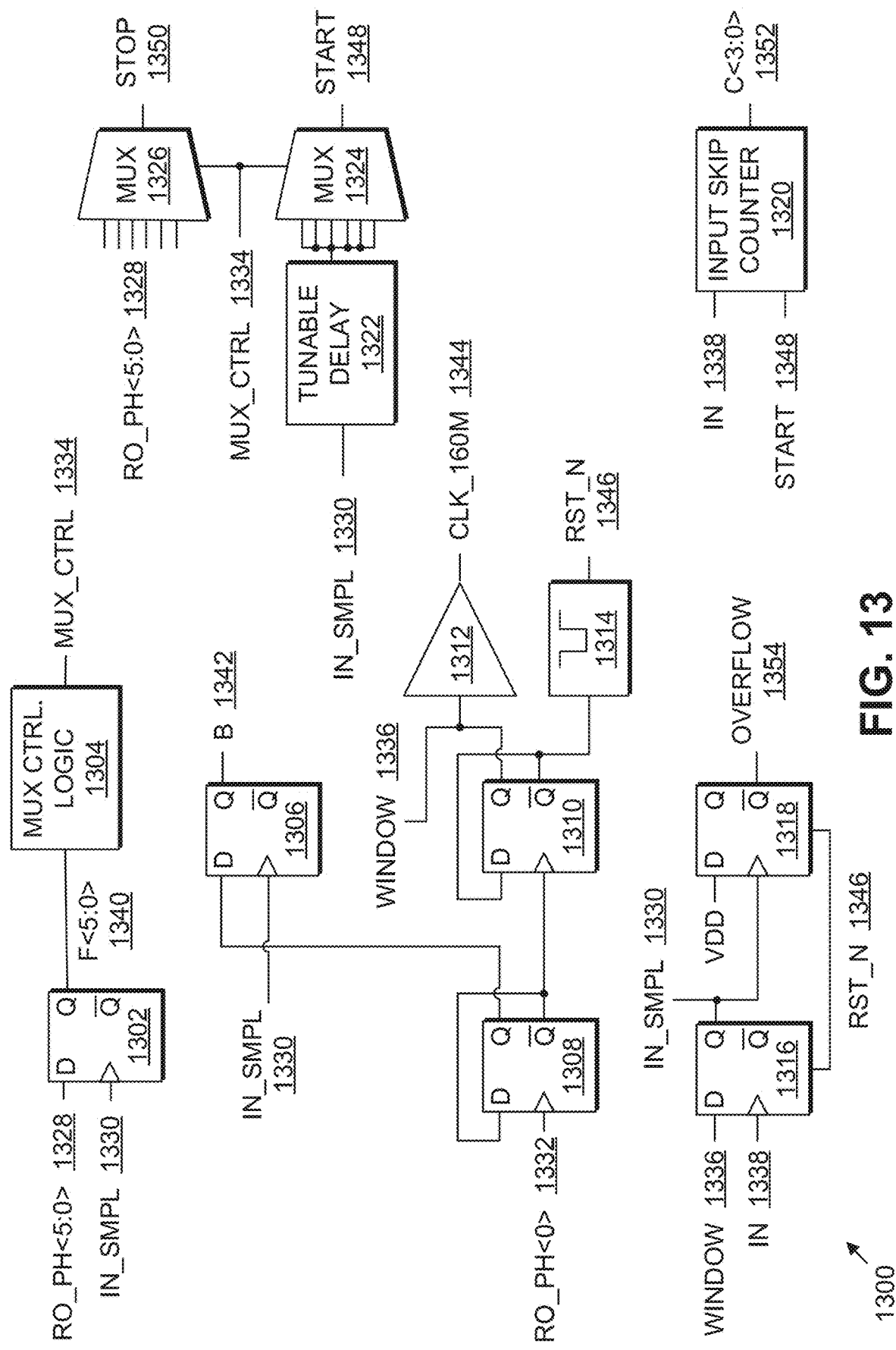
FIG. 13 is a schematic diagram illustrating a first example windowing circuit according to some embodiments.

FIG. 13 is a schematic diagram illustrating a first example windowing circuit 1300 according to some embodiments. A ring oscillator phase signal ("RO_PH<0>") 1332 may be a square wave input signal into the clock of a first D-flip-flop 1308. Rising edges of the ring oscillator phase signal 1332 may trigger alternating outputs on the Q output of the first D-flip-flop 1308 so that the Q output of the first D-flip-flop 1308 is a square wave. The $\overline{Q}$ output of the first D-flip-flop 1308 may control the clock of a second D-flip-flop 1310. The Q output of the second D-flip-flop 1310 may be used as a window signal 1336. A 160 MHz clock signal ("CLK_160M") 1344 may be generated from the window signal 1336 connected to a buffer element 1312. The Q output of the second D-flip-flop 1310 may be used as a reset signal ("RST_N") 1346 that is an inverted pulse signal 1314.

The window signal 1336 may be connected to an input of a third D-flip-flop 1316, with the modulated input signal 1338 connected to the clock of the third D-flip-flop 1316. The Q output of the third D-flip-flop 1316 may be labeled as a sampled modulated input signal ("IN_SMPL") 1330 that contains pulses corresponding to rising edges of the modulated input signal 1338 that occur within a timing window. The Q output of the first D-flip-flop 1306 may be used as an input to a fourth D-flip-flop 1306. The sampled input signal ("IN_SMPL") 1330 may be connected to the clock of the fourth D-flip-flop 1306 to generate a "B" signal 1342 to indicate if a rising edge of the sampled input signal occurred within a timing window, where signal B indicates if the IN_SMPL signal occurred during a first half cycle of the ring oscillator, since the timing has been designed to use 12 phases of a clock that are actually formed from two sets of 6 phases of a faster clock. The sampled input signal 1330 may be connected to the clock of a fifth D-flip-flop 1318 with a VDD signal (+5 V) signal connected to the D input signal. The Q output of the fifth D-flip-flop 1318 may be an overflow signal 1354 that may be connected to the overflow signal of FIG. 12.

The sampled input signal 1330 may be connected to the clock of a sixth D-flip-flop 1302 with a ring oscillator phase signal ("RO_PH<5:0>") 1328 connected to the D input of the sixth D-flip-flop 1302. The Q output of the sixth D-flip-flop 1302 is labeled as a ring oscillator phase signal ("F<5: 0>") 1340. The ring oscillator phase signal 1340 is used as an input to a multiplexer control logic circuit 1304 that generates a multiplexer control signal 1334.

The sampled input signal 1330 may be used an input to a tunable delay circuit (or component for some embodiments) 1322. The multiplexer control signal 1334 may be connected as a select line to a first multiplexer 1324 and a second multiplexer 1326. The output of the tunable delay circuit 1322 may be tied to all of the input lines of the first multiplexer 1324. The first multiplexer 1324 may be used to maintain synchronization with the second multiplexer 1326. The output of the first multiplexer 1324 may be the start signal 1348 used by the fine TDC circuit. The start signal may be a delayed pulse of the sampled input signal 1330. The multiplexer control signal 1334 may be used to select a ring oscillator phase signal ("RO_PH<5:0>") 1328 via the second multiplexer 1326. The selected ring oscillator phase signal 1328 may be used as the stop signal 1350 of the fine TDC circuit.

The modulated input signal 1338 and the start signal 1348 may be inputs to an input skip counter circuit 1320 that outputs a modulated input signal rising edge counter ("C<3: 0>") 1352. The modulated input signal rising edge counter ("C<3:0>") 1352 may be incremented for each rising edge of the modulated input signal 1338 that occurs after each TDC_OUT measurement 1250 of FIG. 12. The modulated input signal rising edge counter 1352 may be from 0 to 3, from 0 to 6, or over a different range for some embodiments. The input skip counter circuit 1320 may be used to count how many rising edges of the modulated input signal were skipped.

Figure 14A:
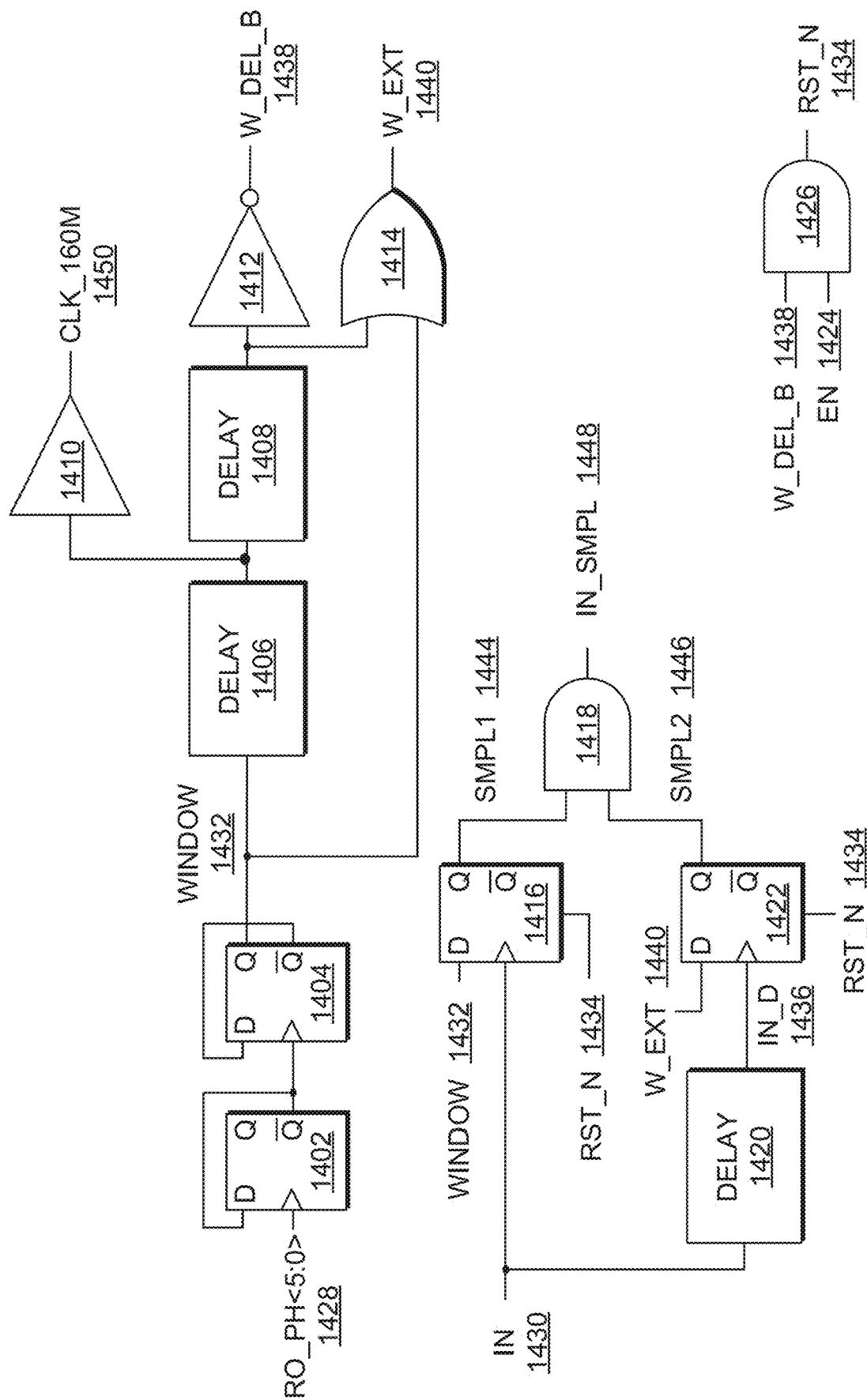
FIG. 14A is a schematic diagram illustrating a second example windowing circuit according to some embodiments.
Figure 14B:
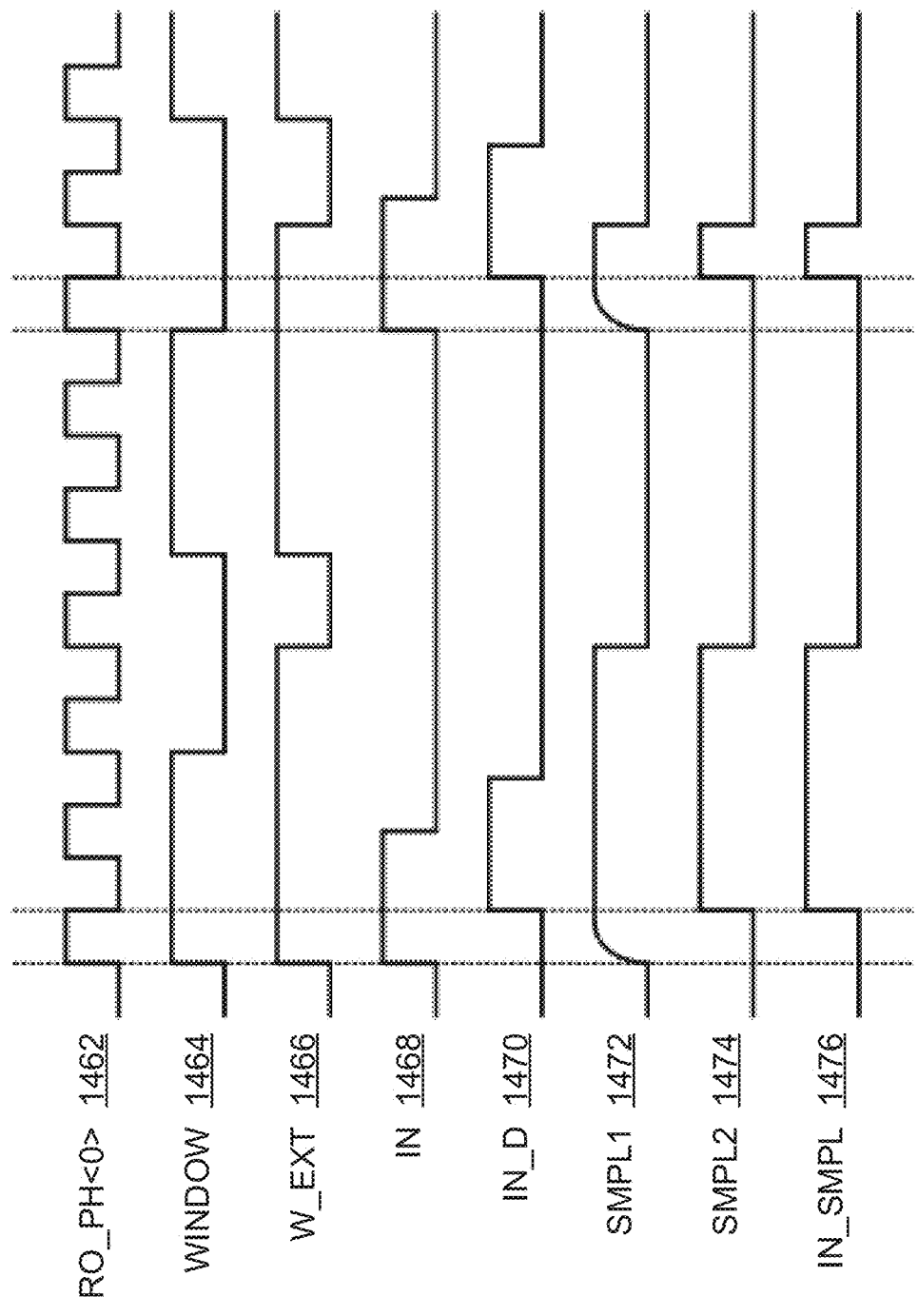
FIG. 14B is a timing diagram illustrating an example set of signal timings for a windowing circuit according to some embodiments.

FIG. 14A is a schematic diagram illustrating a second example windowing circuit 1400 according to some embodiments. FIG. 14B is a timing diagram illustrating an example set of signal timings 1460 for a windowing circuit according to some embodiments. FIGS. 14A and 14B will be discussed together. A ring oscillator phase signal ("RO_PH<5:0>") 1428, 1462 may be a square wave input signal into the clock of a first D-flip-flop 1402. Rising edges of the ring oscillator phase signal 1428, 1462 may trigger alternating outputs on the Q output of the first D-flip-flop 1402 so that the Q output of the first D-flip-flop 1402 is a square wave. The Q output of the first D-flip-flop 1402 may control the clock of a second D-flip-flop 1404. The Q output of the second D-flip-flop 1404 may be used as a window signal 1432, 1464. The window signal 1432 may be delayed with two delay elements 1406, 1408. The window signal and the delayed window signal may be logically-XORed using an XOR gate 1414 to generate an extended window signal 1440, 1466. The delayed window signal may be inverted with inverter 1412 to generate a delayed window "B" signal ("W_DEL_B") 1438. A 160 MHz clock signal ("CLK_160M") 1450 may be generated from the window signal 1432 delayed through one delay element 1406 and a buffer element 1410.

The delayed window "B" signal 1438 for some embodiments may be a delayed and inverted pulse that may be connected to a logic AND gate 1426. An enable signal ("EN") 1424 is also connected to the logic AND gate 1426. The output of the logic AND gate 1426 is a reset signal ("RST_N") 1434. If the enable signal 1424 is high, the reset signal 1434 may be low during the time of the delayed window "B" signal's 1438 inverted pulse.

A rising edge of a received modulated signal ("IN") 1430, 1468 may control a D-flip-flop 1416 if a reset signal ("RST_N") 1434 is low. If the reset signal 1434 is low when the rising edge of the received modulated signal goes high, the output ("SMPL1") 1444, 1472 of the D-flip-flop 1416 will follow the window signal input 1432, 1464. Hence, the first sample signal 1444, 1472 goes gradually higher to match the window input signal 1432, 1464.

A rising edge of the received modulated signal ("IN") 1430, 1468 also propagates through a delay element 1420 to generate a rising edge of a delayed modulated signal ("IN_D") 1436, 1470. The delayed modulated signal 1436 may control a D-flip-flop 1422 if the reset signal 1434 is low. If the reset signal 1434 is low when the rising edge of the delayed modulated signal goes high, the output ("SMPL2") 1446, 1474 of the D-flip-flop 1422 will follow the extended window signal 1440. The second sample signal 1446, 1474 goes high to match the extended window signal 1440. If the modulated signal 1468 has a rising edge while the window signal 1464 is high, and the delayed modulated signal 1470 has a rising edge while the extended window signal 1466 is high, the first sample signal 1444, 1472 and the second sample signal 1446, 1474 will have an overlapping portion with both signals in the high state. As a result, the output ("IN_SMPL") 1448, 1476 of the AND-gate 1418 will be high during the overlapping portion. With some embodiments, the sampled input signal 1448, 1476 may be connected to the clock of a D-flip-flop with a VDD signal (+5 V) signal connected to the D input signal. The output of the D-flip-flop may be an overflow signal that may be connected to the overflow signal of FIG. 12.

For some embodiments, generation of a carrier-based phase correction value may be inhibited if a rising edge of the modulated signal does not occur within a timing window. Some embodiments of an apparatus may include an overflow circuit coupled to a carrier-based phase correction circuit and configured to inhibit generating a carrier-based phase correction value if a rising edge of the modulated signal does not occur within a timing window. For example, the difference of the carrier-based phase correction value and the phase measurement that may be determined via the circuit in FIG. 12 may be inhibited by an overflow signal. With some embodiments, the overflow signal may be generated using the method and/or apparatus described above.

FIG. 15 is a schematic diagram illustrating an example frequency scaling circuit 1500 according to some embodiments. A modulated signal received by an antenna 1502 may have a carrier frequency of 2.4 GHz, such as a 802.11g orthogonal frequency division modulated (OFDM) signal, for example. For some embodiments, a 2.4 GHz modulated receive signal may be divided by a divide-by-8 component (or a divide-by-8 circuit) 1504 to obtain a modulated input signal (or modulated signal) with a carrier frequency of 300 MHz. For some embodiments, a 2.4 GHz modulated receive signal may be divided by a divide-by-4 component (or a divide-by-4 circuit) 1506 and mixed with a 320 MHz sinusoidal signal 1510 using a mixer 1508 to obtain a modulated input signal with a carrier frequency of 280 MHz. Some embodiments may have the divide-by-8 circuit 1504; some embodiments may have the divide-by-4 circuit with a mixer 1508; and some embodiments may have the divide-by-8 circuit 1504, the divide-by-4 circuit 1506, the mixer 1508, and the MUX 1512. The output of the MUX 1512 (or the output of the divide-by-8 circuit or the output of the mixer 1508 for some embodiments) may be inputted into the TDC circuit 1514.

The output of the TDC may be a phase measurement between the modulated signal (which is inputted into the TDC circuit 1514) and the local clock signal (which may be the 640 MHz ring oscillator signal divided by 4). A corrected phase measurement value may be generated based on a difference between the TDC output phase measurement and a carrier-phase correction value 1518. The corrected phase measurement value may be multiplied by a multiply-by-4 component (or circuit) 1520 or by a multiply-by-8 component (or circuit) 1522 and may be further multiplied by a channel frequency scaling factor to convert the corrected phase measurement value relative to the carrier frequency. The output of the channel frequency scaling factor circuit 1524 is outputted to the CORDIC 1526, which may generate in-phase (I) 1528 and quadrature (Q) 1530 signals. For some embodiments, the channel frequency scaling factor may be generated by dividing the frequency of the input signal into the TDC 1514 by the frequency of a local oscillator (LO) clock signal 1516, which may be a 320 MHz sinusoidal signal for some embodiments:

$$\text{Channel } Freq.Scaling \text{ Factor} = \frac{Freq. \text{ of the Input Signal into the } TDC}{\text{Frequency of the Local Clock Signal}}$$

With some embodiments, a corrected phase measurement value may be converted from a value relative to a local clock frequency to a value relative to a carrier frequency by multiplying the corrected phase measurement value by the channel frequency scaling factor to generate a carrier phase measurement. For some embodiments, the offset 1518 may be a ramp signal. The ramp signal may be an unsynchronized signal and may be subtracted at one of multiple locations in the frequency scaling circuit 1502. The phase offset delta may be continually tracked throughout the TDC ring oscillator, and the offset 1518 may be subtracted from the output of the TDC. For some embodiments, the offset 1518 may be the amount of phase shift that may be added to the measurement for every TDC input due to the carrier frequency of the modulated input not being an exact multiple of a local clock. For some embodiments, the offset 1518 may be equal to the carrier-based phase correction value described above with FIG. 12.

For some embodiments, a modulated signal having a carrier frequency may be received at a receive phase-to-digital conversion (PDC) circuit. A phase measurement between rising edges of the modulated signal and a local clock signal may be obtained. A carrier-phase correction value may be generated by accumulating a phase correction increment, an example of which is shown in FIG. 12. A corrected phase measurement value may be generated based on a difference between the phase measurement and the carrier-phase correction value. A carrier phase measurement may be generated by scaling the corrected phase measurement value. With some embodiments, the carrier phase measurement may be generated by scaling the corrected phase measurement by a multiple of a ratio of the carrier frequency to the frequency of the local clock signal, such as the channel frequency scaling factor shown above, for example.

Some embodiments of an apparatus may include an analog receiver circuit configured to receive a modulated signal having a carrier frequency, a phase-to-digital conversion (PDC) circuit coupled to the analog receiver circuit and configured to obtain a phase measurement between the modulated signal and a local clock signal, a carrier-based phase correction circuit coupled to the PDC circuit and configured to generate a carrier-phase correction value by accumulating a phase correction increment, a corrected phase measurement circuit coupled to the carrier-based phase correction circuit and configured to generate a corrected phase measurement value based on a difference between the phase measurement and the carrier-based phase correction value, and a carrier phase measurement circuit coupled to the corrected phase measurement circuit and configured to generate a carrier phase measurement by scaling the corrected phase measurement value. For some embodiments of an apparatus, the carrier phase measurement circuit may include a multiplier element configured to scale the corrected phase measurement by a multiple of a ratio of the carrier frequency to the frequency of the local clock signal, such as the channel frequency scaling factor shown above, for example.

In some embodiments of a method, a phase measurement value of a modulated carrier may be generated with respect to a phase domain of a local clock using a phase-to-digital converter (PDC). The phase measurement value may be converted to a modulation phase value based on a ratio between a carrier frequency of the modulated carrier and a frequency of the local clock, such as the channel frequency scaling factor shown above, for example.

A TDC output measurement may be taken with every rising edge of a 300 MHz modulated signal for some embodiments. From one sample to the next sample, the phase may change by ±180 degrees. Some embodiments may track the change in phase from sample to sample, not absolute phase. For some embodiments, 360 degrees worth of phase are mapped to 10 bits. A code word corresponding to 361 degrees may be the same as the code word corresponding to 1 degree of phase. A modulo reduction of the phase may be inherent in the use of fixed bit code words.

Figure 16:
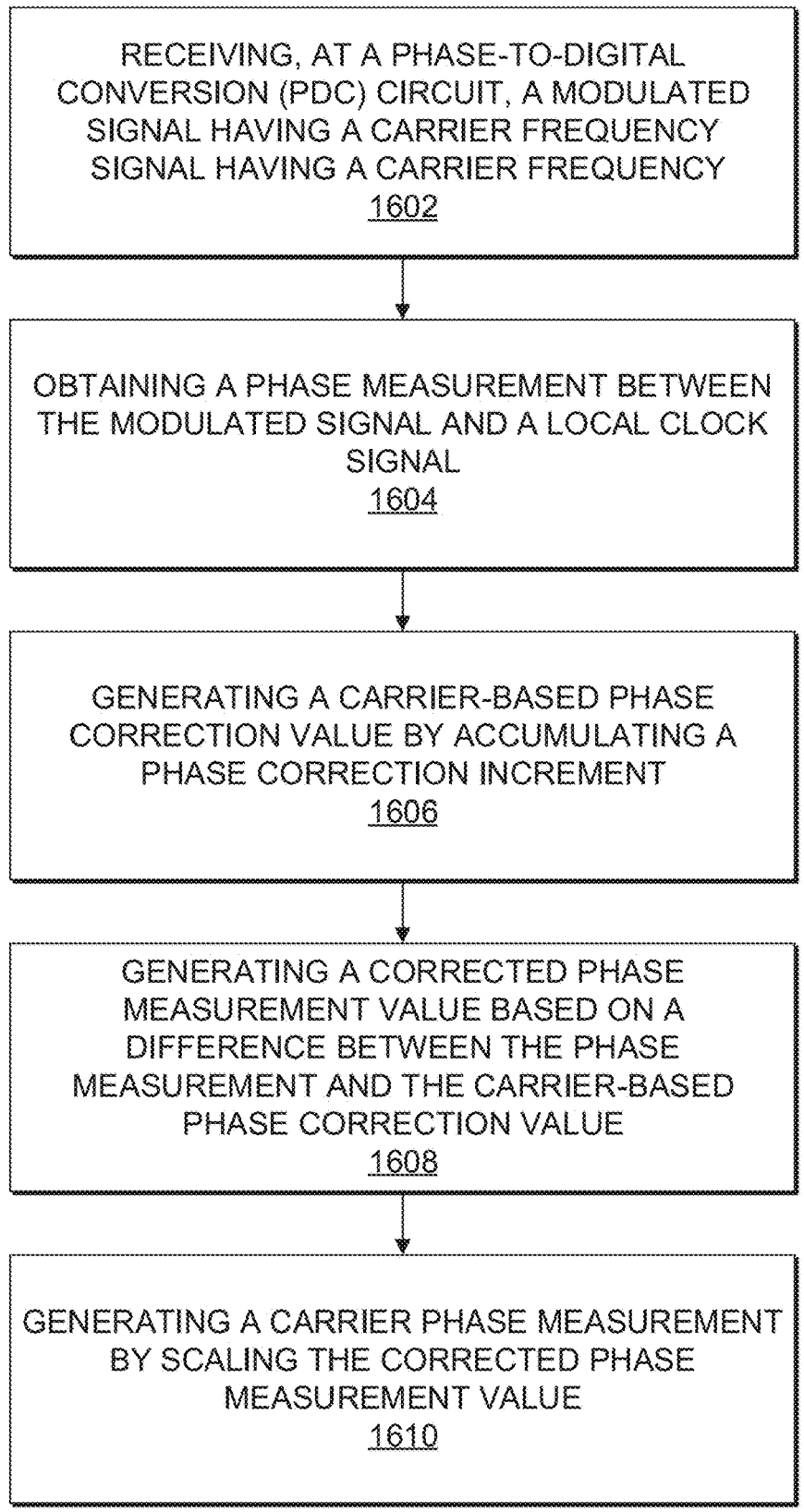
FIG. 16 is a flowchart illustrating an example for generating a carrier phase measurement according to some embodiments.

FIG. 16 is a flowchart illustrating an example process 1600 for generating a carrier phase measurement according to some embodiments. Some embodiments may include receiving 1602, at a receive phase-to-digital conversion (PDC) circuit, a modulated signal having a carrier frequency. A phase measurement may be obtained 1604 between the modulated signal and a local clock signal. A carrier-based phase correction value may be generated 1606 by accumulating a phase correction increment. A corrected phase measurement value may be generated 1608 based on a difference between the phase measurement and the carrier-based phase correction value. A carrier phase measurement may be generated 1610 by scaling the corrected phase measurement value.

Some embodiments of a method may include: receiving, at a receive phase-to-digital conversion (PDC) circuit, a modulated signal having a carrier frequency; obtaining a phase measurement between the modulated signal and a local clock signal; generating a carrier-based phase correction value by accumulating a phase-correction increment; generating a corrected phase measurement value based on a difference between the phase measurement and the carrier-based phase correction value; and generating a carrier phase measurement by scaling the corrected phase measurement value.

In some embodiments, generating the phase correction increment may be based on (i) a count of periods of the modulated signal occurring between each generation of a corrected phase measurement, and (ii) a difference between the carrier frequency and a frequency of the local clock signal.

With some embodiments, generating the carrier-based phase correction value may be inhibited if a rising edge of the modulated signal does not occur within a timing window.

For some embodiments, obtaining the phase measurement may include: determining a coarse measurement by determining a phase interval of a plurality of phase intervals of the local clock that coincides with a rising edge of the modulated signal; determining a fine measurement error of the coarse measurement; and determining the phase measurement by combining the coarse measurement and the fine measurement error.

In some embodiments, combining the coarse measurement and the fine measurement may include: scaling the coarse measurement by a coarse measurement scaling factor; and scaling the fine measurement error by a fine measurement scaling factor.

With some embodiments, scaling the coarse measurement may convert the coarse measurement from an index of the phase interval to a phase angle value, and scaling the fine measurement may convert the fine measurement error from a time value to phase with respect to the local clock signal.

For some embodiments, determining the phase interval may be determined according to a state of a plurality of ring oscillator elements.

In some embodiments, determining the fine measurement error may include: injecting, into a slow line of two-dimensional Vernier delay elements, a rising edge of the modulated signal; injecting, into a fast line of two-dimensional Vernier delay elements, an output of the ring oscillator associated with the determined phase interval; and determining a fine measurement error using a matrix of arbiters connected between the slow line and fast line.

With some embodiments, generating the carrier phase measurement may include scaling the corrected phase measurement by a multiple of a ratio of the carrier frequency to the frequency of the local clock signal.

For some embodiments, a method may further include preprocessing the modulated signal by reducing the frequency using a harmonic injection ILO.

In some embodiments, a method may further include preprocessing the modulated signal by reducing the frequency using a divider circuit.

With some embodiments, a method may further include preprocessing the modulated signal by reducing the frequency using a mixer circuit.

Some embodiments of an apparatus may include: an analog receiver circuit configured to receive a modulated signal having a carrier frequency; a phase-to-digital conversion (PDC) circuit coupled to the analog receiver circuit and configured to obtain a phase measurement between the modulated signal and a local clock signal; a carrier-based phase correction circuit coupled to the PDC circuit and configured to generate a carrier-based phase correction value by accumulating a phase-correction increment; a corrected phase measurement circuit coupled to the carrier-based phase correction circuit and configured to generate a corrected phase measurement value based on a difference between the phase measurement and the carrier-based phase correction value; and a carrier phase measurement circuit coupled to the corrected phase measurement circuit and configured to generate a carrier phase measurement by scaling the corrected phase measurement value.

For some embodiments, the carrier-based phase correction circuit may include a lookup table.

In some embodiments, the phase correction increment may be based on (i) a count of periods of the modulated signal occurring between each generation of a corrected phase measurement, and (ii) a difference between the carrier frequency and a frequency of the local clock signal.

For some embodiments, the count of periods of the modulated signal may be used to control a multiplexer to select a table entry storing a multiple of a single period carrier offset value.

With some embodiments, an apparatus may further include an overflow circuit coupled to the corrected phase measurement circuit and configured to inhibit generating the carrier-based phase correction value if a rising edge of the modulated signal does not occur within a timing window.

For some embodiments, the PDC circuit may include: a coarse measurement circuit configured to determine a coarse measurement by determining a phase interval of a plurality of phase intervals of the local clock that coincides with a rising edge of the modulated signal; a fine measurement error circuit coupled to the coarse measurement circuit and configured to determine a fine measurement error of the coarse measurement; and a phase measurement circuit coupled to the fine measurement circuit and configured to determine the phase measurement by combining the coarse measurement and the fine measurement error.

In some embodiments, an apparatus may further include: a coarse measurement scaling circuit coupled to the coarse measurement circuit and configured to scale the coarse measurement by a coarse measurement scaling factor; and a fine measurement scaling circuit coupled to the fine measurement error circuit and configured to scale the fine measurement error by a fine measurement scaling factor.

With some embodiments, the coarse measurement scaling circuit may use the coarse measurement scaling factor to convert the coarse measurement from an index of the phase interval to a phase value, and the fine measurement scaling circuit may use the fine measurement scaling factor to convert the fine measurement error from a time value to phase with respect to the local clock signal.

For some embodiments, the coarse measurement circuit may include a plurality of ring oscillator elements.

In some embodiments, the fine measurement error circuit may include: a first set of one or more inverters forming a first line of delay elements; a second set of one or more inverters forming a second line of delay elements, wherein the first line of delay elements is slower than the second line of delay elements; a matrix of latches equal to the number of inverters in the first line of delay elements times the number of inverters in the second line of delay elements; a set of connections that connect each inverter output in the first line of delay elements to each first latch input in a column of the matrix of latches; and a set of connections that connect each inverter output in the second line of delay elements to each second latch input in a row of the matrix of latches.

With some embodiments, the carrier phase measurement circuit may include a multiplier element configured to scale the corrected phase measurement by a multiple of a ratio of the carrier frequency to the frequency of the local clock signal.

For some embodiments, an apparatus may further include a harmonic injection ILO to reduce the frequency of the modulated signal.

In some embodiments, an apparatus may further include a divider circuit to reduce the frequency of the modulated signal.

With some embodiments, an apparatus may further include a mixer circuit to reduce the frequency of the modulated signal.

Some embodiments of a method may include: obtaining a plurality of phase measurements of a local clock associated with signal transitions of a carrier having a carrier frequency and a phase-modulation component; generating an adjusted local clock phase measurement by subtracting an offset based on a frequency difference between the carrier frequency and a frequency of the local clock; and generating a phase modulation value by scaling the adjusted local clock phase measurement based on a ratio between the carrier frequency and the frequency of the local clock.

Some embodiments of a method may include: generating a phase measurement value of a modulated carrier with respect to a phase domain of a local clock using a phase-to-digital converter; and converting the phase measurement value to a modulation phase value based on a ratio between a carrier frequency of the modulated carrier and a frequency of the local clock.

In the foregoing specification, specific embodiments have been described. However, one of ordinary skill in the art would appreciate that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about", or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may comprise one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein as "modules." The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage media include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed:

1. A method comprising:
  obtaining, using a phase-to-digital conversion (PDC) circuit, a phase measurement between a received modulated signal having a carrier frequency and a local clock signal;
  generating a carrier-based phase correction value by accumulating a phase-correction increment;
  generating a corrected phase measurement value based on a difference between the phase measurement and the carrier-based phase correction value; and
  generating a carrier phase measurement by scaling the corrected phase measurement value.

2. The method of claim 1, wherein generating the phase-correction increment is based on (i) a count of periods of the modulated signal occurring between each generation of a corrected phase measurement, and (ii) a difference between the carrier frequency and a frequency of the local clock signal.

3. The method of claim 2, wherein generating the carrier-based phase correction value is inhibited if a rising edge of the modulated signal does not occur within a timing window.

4. The method of claim 1, wherein obtaining the phase measurement comprises:
  determining a coarse measurement by determining a phase interval of a plurality of phase intervals of the local clock that coincides with a rising edge of the modulated signal;
  determining a fine measurement error of the coarse measurement; and
  determining the phase measurement by combining the coarse measurement and the fine measurement error.

5. The method of claim 4, wherein combining the coarse measurement and the fine measurement further comprises:
  scaling the coarse measurement by a coarse measurement scaling factor; and
  scaling the fine measurement error by a fine measurement scaling factor.

6. The method of claim 5,
  wherein scaling the coarse measurement converts the coarse measurement from an index of the phase interval to a phase angle value, and
  wherein scaling the fine measurement converts the fine measurement error from a time value to phase with respect to the local clock signal.

7. The method of claim 4, wherein determining the phase interval is determined according to a state of a plurality of ring oscillator elements.

8. The method of claim 7, wherein determining the fine measurement error comprises:
  injecting, into a slow line of two-dimensional Vernier delay elements, a rising edge of the modulated signal;
  injecting, into a fast line of two-dimensional Vernier delay elements, an output of the ring oscillator associated with the determined phase interval; and
  determining a fine measurement error using a matrix of arbiters connected between the slow line and fast line.

9. The method of claim 1, wherein generating the carrier phase measurement comprises scaling the corrected phase measurement by a multiple of a ratio of the carrier frequency to the frequency of the local clock signal.

10. The method of claim 1, further comprising preprocessing the modulated signal by reducing the frequency using a harmonic injection ILO.

11. The method of claim 1, further comprising preprocessing the modulated signal by reducing the frequency using a divider circuit.

12. The method of claim 1, further comprising preprocessing the modulated signal by reducing the frequency using a mixer circuit.

13. An apparatus comprising:
  a phase-to-digital conversion (PDC) circuit configured to obtain a phase measurement between the modulated signal and a local clock signal;
  a carrier-based phase correction circuit coupled to the PDC circuit and configured to generate a carrier-based phase correction value by accumulating a phase-correction increment;
  a corrected phase measurement circuit coupled to the carrier-based phase correction circuit and configured to generate a corrected phase measurement value based on a difference between the phase measurement and the carrier-based phase correction value; and
  a carrier phase measurement circuit coupled to the corrected phase measurement circuit and configured to generate a carrier phase measurement by scaling the corrected phase measurement value.

14. The apparatus of claim 13, wherein the PDC circuit comprises:
  a coarse measurement circuit configured to determine a coarse measurement by determining a phase interval of a plurality of phase intervals of the local clock that coincides with a rising edge of the modulated signal;
  a fine measurement error circuit coupled to the coarse measurement circuit and configured to determine a fine measurement error of the coarse measurement; and
  a phase measurement circuit coupled to the fine measurement circuit and configured to determine the phase measurement by combining the coarse measurement and the fine measurement error.

15. The apparatus of claim 14, further comprising:
  a coarse measurement scaling circuit coupled to the coarse measurement circuit and configured to scale the coarse measurement by a coarse measurement scaling factor; and
  a fine measurement scaling circuit coupled to the fine measurement error circuit and configured to scale the fine measurement error by a fine measurement scaling factor.

16. The apparatus of claim 15,
  wherein the coarse measurement scaling circuit uses the coarse measurement scaling factor to convert the coarse measurement from an index of the phase interval to a phase value, and wherein the fine measurement scaling circuit uses the fine measurement scaling factor to convert the fine measurement error from a time value to phase with respect to the local clock signal.

17. The apparatus of claim 14, wherein the coarse measurement circuit comprises a plurality of ring oscillator elements.

18. The apparatus of claim 14, wherein the fine measurement error circuit comprises:
- a first set of one or more inverters forming a first line of delay elements;
- a second set of one or more inverters forming a second line of delay elements, wherein the first line of delay elements is slower than the second line of delay elements;
- a matrix of latches equal to the number of inverters in the first line of delay elements times the number of inverters in the second line of delay elements;
- a set of connections that connect each inverter output in the first line of delay elements to each first latch input in a column of the matrix of latches; and
- a set of connections that connect each inverter output in the second line of delay elements to each second latch input in a row of the matrix of latches.

19. The apparatus of claim 13, further comprising a harmonic injection ILO to reduce the frequency of the modulated signal.

20. A method comprising:
- receiving a carrier having a carrier frequency and a phase-modulation component;
- obtaining a plurality of phase measurements of a local clock associated with signal transitions of the carrier having the carrier frequency and the phase-modulation component;
- generating an adjusted local clock phase measurement by subtracting an offset based on a frequency difference between the carrier frequency and a frequency of the local clock; and
- generating a phase modulation value by scaling the adjusted local clock phase measurement based on a ratio between the carrier frequency and the frequency of the local clock.

\* \* \* \* \*